(12) United States Patent
Arima

(10) Patent No.: US 6,815,765 B2
(45) Date of Patent: Nov. 9, 2004

(54) SEMICONDUCTOR DEVICE WITH FUNCTION OF MODULATING GAIN COEFFICIENT AND SEMICONDUCTOR INTEGRATED CIRCUIT INCLUDING THE SAME

(75) Inventor: Yutaka Arima, Iizuka (JP)

(73) Assignee: Exploitation of Next Generation Co., Ltd., Fukuoka (JP)

( * ) Notice: Subject to any disclaimer, the term of this patent is extended or adjusted under 35 U.S.C. 154(b) by 23 days.

(21) Appl. No.: 10/178,562

(22) Filed: Jun. 25, 2002

(65) Prior Publication Data

US 2003/0006438 A1 Jan. 9, 2003

(30) Foreign Application Priority Data

Jun. 26, 2001 (JP) .......................................... 2001-192887

(51) Int. Cl.[7] .............................................. H01L 29/76
(52) U.S. Cl. ..................... 257/327; 257/282; 257/285; 257/286; 257/288; 257/327; 257/344; 257/345; 257/346; 257/348; 257/350; 257/351; 438/282; 438/309; 438/311

(58) Field of Search ................................ 257/282, 285, 257/286, 288, 327, 344, 345, 346, 348, 350, 351; 438/282, 309, 311

(56) References Cited

U.S. PATENT DOCUMENTS

| | | | | | |
|---|---|---|---|---|---|
| 4,868,629 | A | * | 9/1989 | Eitan ............................ | 357/45 |
| 5,436,482 | A | * | 7/1995 | Ogoh ........................... | 257/344 |
| 5,517,049 | A | * | 5/1996 | Huang ......................... | 257/357 |
| 6,200,863 | B1 | * | 3/2001 | Xiang et al. ................. | 438/286 |
| 6,469,347 | B1 | * | 10/2002 | Oda et al. .................... | 257/345 |

* cited by examiner

*Primary Examiner*—Allan R. Wilson
*Assistant Examiner*—Edgardo Ortiz
(74) *Attorney, Agent, or Firm*—Finnegan, Henderson, Farabow, Garrett & Dunner, L.L.P.

(57) ABSTRACT

A semiconductor device has a structure in which an impurity diffusion region with an impurity concentration lower than an impurity concentration of a source and a drain is formed between the source and drain and a channel below the gate, having an asymmetric shape with respect to a center line along which the gate extends.

19 Claims, 20 Drawing Sheets

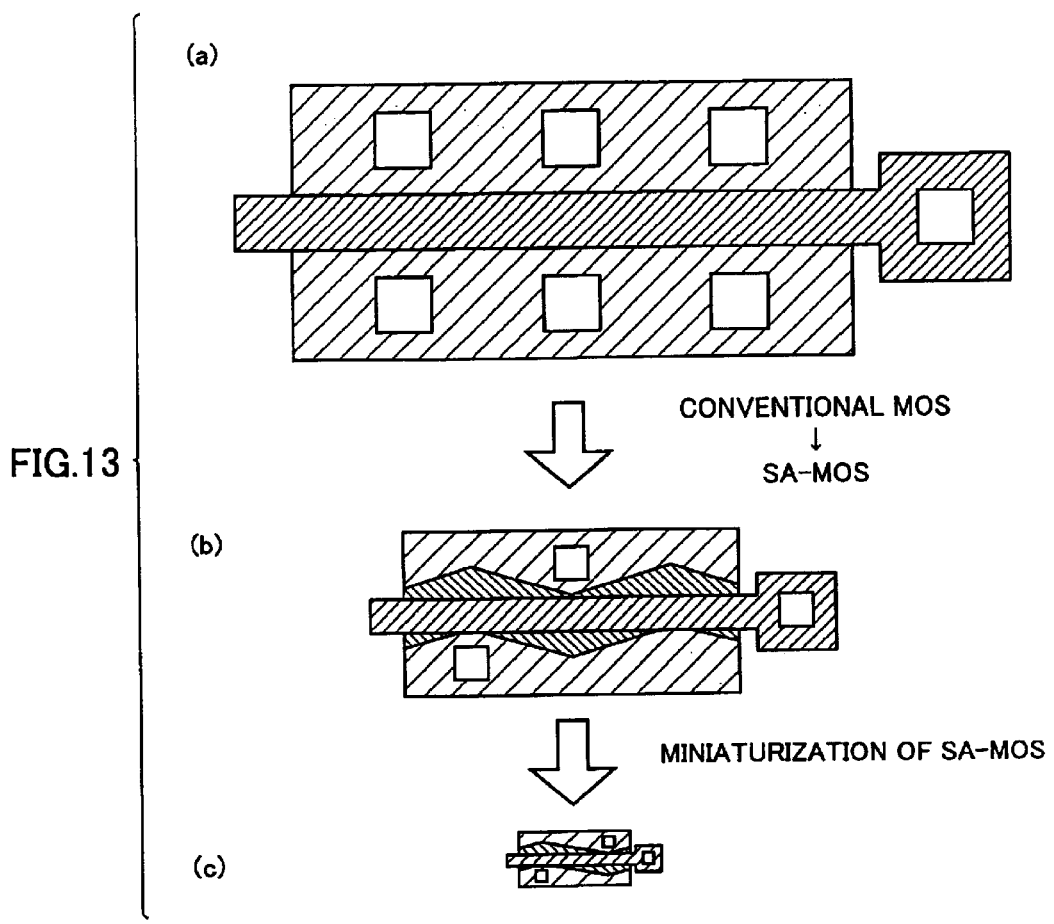

p-ch SA-MOS    n-ch SA-MOS p-ch A-MOS  n-ch A-MOS

FIG.21
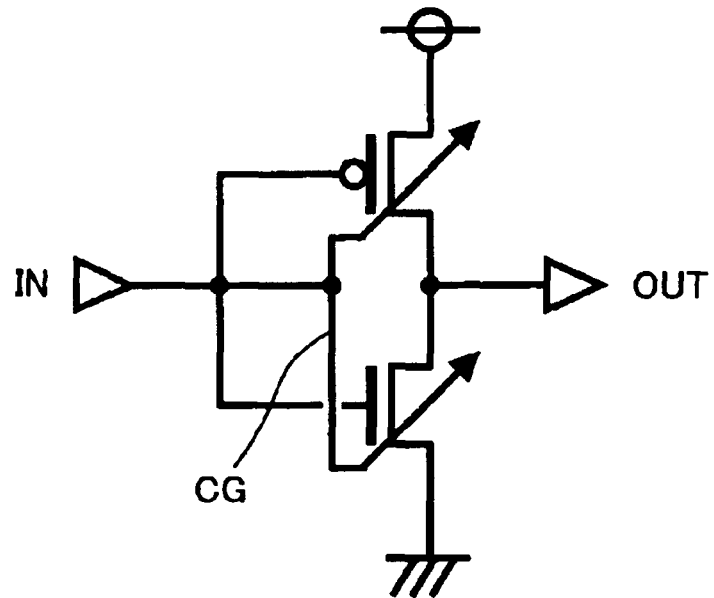
FIG.22
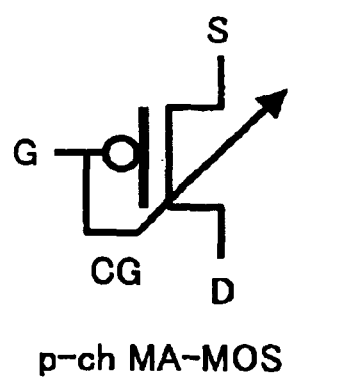
p-ch MA-MOS
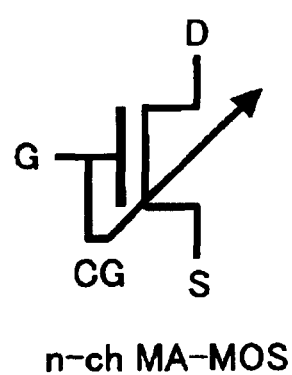
n-ch MA-MOS

SEMICONDUCTOR DEVICE WITH FUNCTION OF MODULATING GAIN COEFFICIENT AND SEMICONDUCTOR INTEGRATED CIRCUIT INCLUDING THE SAME

TITLE OF THE INVENTION

Semiconductor Device with of Modulating Gain Coefficient and Semiconductor Integrated Circuit Including the Same

BACKGROUND OF THE INVENTION

1. Field of the Invention

The present invention relates to a device structure that relieves a limit of miniaturization due to physical constraints of the device structure in a semiconductor integrated circuit (e.g. LSI: Large Scale Integrated circuit), and a configuration of a semiconductor integrated circuit having the device as a component.

2. Description of the Background Art

Semiconductor integrated circuits represented by LSI have improved in performance, i.e., increase in integration and speed, and reduction in power consumption, by mainly miniaturizing devices for over thirty years since its manufacturing technology was established.

In these days when a minimum wiring width indicating the level of device miniaturization have reached 0.15 μm, however, various constraints due to physical phenomenon have become obvious in the device miniaturization. The minimum wiring width generally corresponds to a gate length L of a transistor. Such constraints makes it difficult to further miniaturize devices by the conventional technique, meaning that improvement in LSI performance by the device miniaturization can no longer be expected in the conventional trend.

First, the outline and future problems of the conventional miniaturization technique of semiconductor devices will be described. FIG. 26 schematically shows an example in which a device is miniaturized according to a constant electric-field scaling law, the most popular rule for MOS (Metal Oxide Semiconductor) transistors.

FIG. 26 (b) illustrates an MOS transistor which is reduced to a scale of one-half of the device shown in FIG. 26 (a). Important parameters for determining the characteristic of the MOS transistor includes, as shown in FIG. 26 (a), a gate length L, a gate width W, a thickness of an insulation film (a thickness of a gate oxide film) $T_{OX}$, a diffusion depth of source and drain $X_j$, a concentration of impurities introduced at a substrate or a channel portion directory below the gate, and a power-supply voltage $V_d$.

TABLE 3

Scaling Law for Device

| Parameter | Constant electric-field proportional scaling down | $T_{ox}$ constant proportional scaling down |
|---|---|---|
| Gate length L | 1/α | 1/α |
| Gate width W | 1/α | 1/α |
| Thickness of oxide film $T_{ox}$ | 1/α | 1 |
| Junction depth $X_1$ | 1/α | 1/α |
| Impurity concentration N | α | α |
| Voltage Vd | 1/α | 1/α |

A scaling law for these parameters is, as indicated in the middle column in Table 3, the constant electric-field scaling law where L, W, $T_{OX}$, $X_j$ and $V_d$, are reduced by an inverse of a scaling parameter α and only N is multiplied by α.

According to the constant electric-field scaling law, the magnitude of the electric field is constant irrespective of size reduction of the device. MOS transistors and the like have a constraint in that the electric field within the device (in particular, in the drain or the like) cannot be increased to prevent hot carriers from increasing in order to ensure reliability.

As a physical phenomenon, however, current starts to flow between the substrate (or the channel portion directly below the gate) and a gate electrode when thickness of insulation film (thickness of gate oxide film) $T_{OX}$ becomes thinner than approximately 3 nm. Thus, the thickness of the gate oxide film cannot be made thinner than approximately 3 nm because of the physical constraint of tunnel current. Thickness of insulation film (thickness of gate oxide film) $T_{OX}$ of 3 nm corresponds with gate length L of approximately 0.12 μm.

If gate length L is approximately 0.12 μm or shorter, miniaturization must be performed according to an irregular constant electric-field scaling law in which only thickness of insulation film (thickness of gate oxide film) $T_{OX}$ is constant, as indicated in the rightmost column in Table 3. Moreover, it is required for an MOS transistor to suppress its short channel effect in order to accurately operate as a switch device. For that purpose, diffusion depth $X_j$ of the source and drain must be reduced by a factor of 1/α, while the concentration of introduced impurities must be increased so as to lower the electric resistance, in order to prevent deterioration of drivability of the source and drain. Furthermore, because the source and drain are formed by diffusion, it had gradually been difficult to reduce diffusion depth $X_j$ at a rate of 1/α if diffusion depth $X_j$ becomes smaller than several tens of nm.

In recent years, therefore, effective reduction of diffusion depth $X_j$ (i.e. suppress of the short channel effect) has been expected by a so-called fully-depleted SOI (Silicon On Insulator) device in which an Si thin film is formed on an insulation film and a transistor is formed thereon. For practical application of the SOI device, however, a back-stage effect, a substrate potential floating, a parasitic bipolar effect and the like must be newly addressed, leaving some technical issues to be solved.

Here, assuming that diffusion depth $X_j$ can be effectively reduced at a rate of 1/α by e.g. the fully-depleted SOI device, and that the irregular constantelectic-filed scaling down can be performed where only thickness of insulation film (thickness of gate oxide film) $T_{OX}$ is constant when gate length L is 0.12 μm or shorter, the trend of the LSI performance is estimated in the device miniaturization. FIG. 27 shows a conventional trend of device miniaturization, with consideration given to the physical constraints for thickness of insulation film (thickness of gate oxide film) $T_{OX}$.

Referring to FIG. 27, it is assumed that $C_{OX}$ is a gate capacitance which is inversely proportional to thickness of insulation film (thickness of gate oxide film) $T_{OX}$, and that a dielectric constant ε of the insulation film is constant. Since the drivability of the device is proportional to gate capacitance $C_{OX}$, improvement in performance can be expected by multiplying dielectric constant ε of the insulation film by α even if thickness of insulation film (thickness of gate oxide film) $T_{OX}$ is constant. To change dielectric constant ε of the insulation film, however, the material for the insulation film must be changed, which appears to be difficult in practical application.

TABLE 4

Scaling law for Wiring

| Parameter | σ constant proportional scaling down | Proportional scaling down |
|---|---|---|
| Wiring length l | $1/\alpha$ | $1/\alpha$ |
| Wiring width w | $1/\alpha$ | $1/\alpha$ |
| Thickness of wiring & interlayer film k,t | $1/\alpha$ | $1/\alpha$ |
| Wiring material conductivity σ | 1 | $\alpha$ |
| Wiring resistance Rm ∝ wk σ/l | $\alpha$ | 1 |
| Wiring capacitance Cm ∝ lw/t | $1/\alpha$ | $1/\alpha$ |
| Wiring delay time Tm ∝ CmRm | 1 | $1/\alpha$ |

Table 4 shows a scaling law for wiring. In order to improve the LSI performance, reduction in the area of wiring that is proportional to the area reduction of the device must be realized for a higher degree of integration. As to increase in operation speed and reduction in power consumption, a wiring capacitance must be reduced. The wiring had conventionally been scaled down without a change of a wiring material (e.g. Al), i.e., with constant electric conductivity σ. Recently, however, a material such as Cu (copper) is introduced in an attempt to increase electrical conductivity σ in order to avoid a revealed wiring delay, i.e., the wiring capacitance being larger with respect to a device capacitance such as a gate capacitance, hindering improvement in the LSI performance. Moreover, a method of making the thickness of wiring or interlayer film larger than that in the scaling rule has been considered. In any case, in the scaling law of wiring, the wiring capacitance that greatly affects a signal delay is expected to be reduced by a factor of $1/\alpha$, as indicated in Table 4.

As to the device and wiring, according to the scaling laws indicated in Tables 3 and 4, effects can be expected for the parameters related to the LSI performance (area A, signal delay time T, power consumption P) indicated in Table 5. Here, because the area is proportional to an inverse of the degree of integration and the signal delay time is proportional to an inverse of operation speed, reduction of either one of the above results in higher performance.

TABLE 5

Effects of Device Reduction

| Parameter | Constant electric-field proportional scaling down | $T_{ox}$ constant proportional scaling down |
|---|---|---|
| Area A ∝ LW | $1/\alpha^2$ | $1/\alpha^2$ |
| Electric field E ∝ V/T | 1 | $1/\alpha$ |
| Capacitance C ∝ A/T + lw/t | $1/\alpha$ | $1/\alpha$ |
| Drain current Ids ∝ WV²/LT | $1/\alpha$ | $1/\alpha^2$ |
| Threshold voltage | $1/\alpha$ | $1/\alpha$ |
| Signal delay time T ∝ CV/I | $1/\alpha$ | 1 |
| Power consumption P ∝ IV | $1/\alpha^2$ | $1/\alpha^3$ |
| Power density P/A | 1 | $1/\alpha$ |

In the leftmost column in Table 5, the relation between the performance parameter and various parameters are indicated. It should be noted that a capacitance C that affects the operation speed and the power consumption is reduced to $1/\alpha$.

Though device capacitance alone is rapidly reduced by a factor of $1/\alpha^2$, the wiring capacitance is reduced by a factor of $1/\alpha$ so that capacitance C which is the sum of the device capacitance and the wiring capacitance is also reduced to $1/\alpha$. At first, the fully-depleted SOI device was expected to have higher performance by reducing its device capacitance. In terms of the LSI miniaturization, however, capacitance C is controlled by the wiring capacitance and is reduced as miniaturization proceeds, producing little effect at the LSI level by the reduction of the device capacitance itself.

As can clearly be seen from Table 5, according to the constant electric-field scaling law applied to the case where gate length L is longer than 0.12 μm, drain current $I_{ds}$ corresponding to the drivability is reduced to $1/\alpha$, and both capacitance C and power-supply voltage $V_d$ are reduced to $1/\alpha$, so that signal delay time T is also reduced to $1/\alpha$, realizing increased speed. When the irregular constant electric-field scaling law applied to the case where gate length L is 0.12 μm or shorter and only thickness of insulation film (thickness of gate oxide film) $T_{OX}$ is constant, however, drain current $I_{ds}$ is reduced to $1/\alpha^2$, resulting in constant signal delay time T, hindering increase of the speed.

The difference in the effects of device reduction for the signal delay speed between the constant electric-field scaling law applied to gate length L of a value higher than 0.12 μm and the irregular constant electric-field scaling law applied to gate length L of 0.12 μm or shorter in which only thickness of insulation film (thickness of gate oxide film) $T_{OX}$ is constant will be described with reference to FIGS. 28 and 30.

FIG. 28 shows the relationship between source-drain voltage $V_{ds}$ and source-drain current $I_{ds}$ in an MOS transistor. FIG. 28 also shows a gain coefficient β of the transistor. The power-supply voltage and gain coefficient before scaling-down are set as $V_{d0}$ and $\beta_0$ respectively, whereas the power-supply voltage and gain coefficient after scaling-down are set as $V_{da}$ and $\beta_a$ respectively. In order for the transistor to accurately operate as a switch device, source-drain current $I_{ds}$ must be prevented from flowing when gate voltage $V_g$ is 0V in nMOS ($V_d$ in pMOS), i.e., when the transistor is in an OFF state, requiring the power-supply voltage to be set as $V_{d0}$, which is the voltage before source-drain current $I_{ds}$ starts to flow. Gate length L is reduced to $1/\alpha$ after the device is scaled down, so that the power-supply voltage at gate voltage $V_g$ of 0V is also reduced to be $V_{da}$.

The reduction in the power-supply voltage is also essential to suppression of hot carriers. As shown at an upper part of FIG. 28, assuming that mobility μ of carriers and dielectric constant ε of the gate insulation film are constant, gain coefficient β is proportional to gate width W and inversely proportional to gate length L and thickness of insulation film (thickness of gate oxide film) $T_{ox}$.

Thus, the gain coefficient after scaling-down is $\beta_a$, α times β, in the case of the constant electric-field scaling law applied to gate length L longer than 0.12 μm, whereas the gain coefficient after scaling-down is constant β0, in the case of the irregular constant electric-field scaling law in which only thickness of insulation film (thickness of gate oxide film) $T_{OX}$ is constant. Accordingly, a load that must be driven by the transistor in each case (power-supply voltage× load capacitance) and drivability (an integral with respect to source-drain voltage $V_{ds}$ of source-drain current $I_{ds}$) are shown in FIGS. 29 and 30 where changes associated with the device reduction are schematically illustrated as areas. The drivability is herein represented by an integral with respect to source-drain voltage $V_{ds}$ of source-drain current $I_{ds}$ because it is assumed that the voltage change in the load is linear with respect to time. It is noted that, though the voltage change in the load is non-linear in practice, assumption that it is linear will not cause a great problem in macroscopic comparison of characteristics.

In the case with the constant electric-field scaling law shown in FIG. 29 for gate length L longer than 0.12 µm, it can be seen that the drivability is more increased by the area ratio with respect to the load, as the device is reduced. On the other hand, in the case with the irregular constant electric-field scaling law shown in FIG. 30 in which only thickness of insulation film (thickness of gate oxide film) $T_{OX}$ is constant, it can be seen that the area ratio of the load and the drivability is almost constant as the device is reduced, so that no increase in speed can be expected.

In sum, expected LSI performance according to the conventional scaling law with consideration given to the above-described physical constraint, i.e. suppression of tunnel current of the gate oxide film, exhibits the trend shown in FIG. 31. These results show that, if gate length L is 0.12 µm or shorter and thus the irregular constant electric-filed scaling law is applied in which only thickness of insulation film (thickness of gate oxide film) $T_{OX}$ is constant, drain current $I_{ds}$ is reduced to $1/\alpha^2$ making signal delay time T constant, thereby hindering increase in the speed. Moreover, various difficulties for suppressing the short-channel effect still remain in the device reduction.

SUMMARY OF THE INVENTION

An object of the present invention is to enable further miniaturization of a device exceeding the limit for miniaturization in the conventional device structure, and to realize further improvement in the performance of a semiconductor integrated circuit (LSI) associated therewith.

According to an aspect of the present invention, a semiconductor device includes a source and a drain formed at respective impurity diffusion regions, a gate formed at a region between the source and the drain with an insulation film interposed, and a structure for modulating a gain coefficient β in accordance with a magnitude of a voltage between the source and the drain.

According to another aspect of the present invention, a semiconductor integrated circuit device includes a semiconductor device including a source and a drain formed at respective impurity diffusion regions, a gate formed at a region between the source and the drain with an insulation film interposed, and a structure for modulating a gain coefficient β in accordance with a magnitude of a voltage between the source and the drain.

According to a further aspect of the present invention, a semiconductor device includes a source and a drain formed at respective impurity diffusion regions, a gate formed at a region between the source and the drain with an insulation film interposed, and a structure for modulating a gain coefficient β in accordance with a magnitude of a voltage of the gate.

According to yet another aspect of the present invention, a semiconductor integrated circuit includes a semiconductor device including a source and a drain formed at respective impurity diffusion regions, a gate formed at a region between the source and the drain with an insulation film interposed, and a structure for modulating a gain coefficient in accordance with a magnitude of a voltage of the gate.

According to the present invention, therefore, the bottleneck of miniaturization due to physical constraints in the conventional MOS device can be overcome, and thus device miniaturization can relatively easily be realized in structure. This can extensively contribute to a wide range of LSI in terms of increase in integration and speed, reduction in power consumption and the like.

Furthermore, the configuration that modulates the gain coefficient β in correspondence to the magnitude of the gate voltage can realize a characteristic of a high withstand voltage and a high gain coefficient during the ON state of the transistor, though the application thereof is limited to a CMOS logic circuit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a plan view showing an example of device miniaturization in a semiconductor device according to the fifth embodiment of the present invention;

FIG. 21 is a circuit diagram showing another example of a logic circuit using a semiconductor device according to the eighth embodiment of the present invention;

FIG. 22 shows an example of symbols used for the semiconductor device according to the eighth embodiment of the present invention;

DESCRIPTION OF THE PREFERRED EMBODIMENTS

Embodiments of the present invention will be described below in detail with reference to the drawings.

Functional Principle of Semiconductor Device of the Invention

The semiconductor device of the present invention is capable of ensuring effective drivability even under the physical constraints for reduction in a thickness of a gate oxide film $T_{OX}$, allowing enhancement in operation speed associated with reduction of the device. The functional point of realizing effectiveness of the semiconductor device of the present invention is that a characteristic is provided that modulates a gain coefficient $\beta$ in accordance with the voltage between the source and drain. That is, when the voltage between the source and drain is high, the effective gate length is increased to attain a higher withstand voltage, whereas the effective gate length is shortened as the voltage between the source and drain is lowered, to increase gain coefficient $\beta$.

The modulation of gain coefficient $\beta$ enables improvement in drivability, while allowing miniaturization of the device according to a scaling law in which thickness of gate oxide film $T_{OX}$, a diffusion depth of source and drain $X_j$ and a concentration of introduced impurities N in a substrate (or a channel portion directly below the gate) are constant. Specifically, the maximum effective gate length is fixed to approximately 0.12 μm, and only the minimum gate length is reduced by a device scaling-down factor of $1/\alpha$. The MOS semiconductor device of the present invention automatically modulates gain coefficient $\alpha$ in inversely proportional to source-drain voltage $V_{ds}$, and hence the device is hereinafter referred to as a Self-Adjusting β-MOS (abbreviated as SA-MOS).

Figure 1:
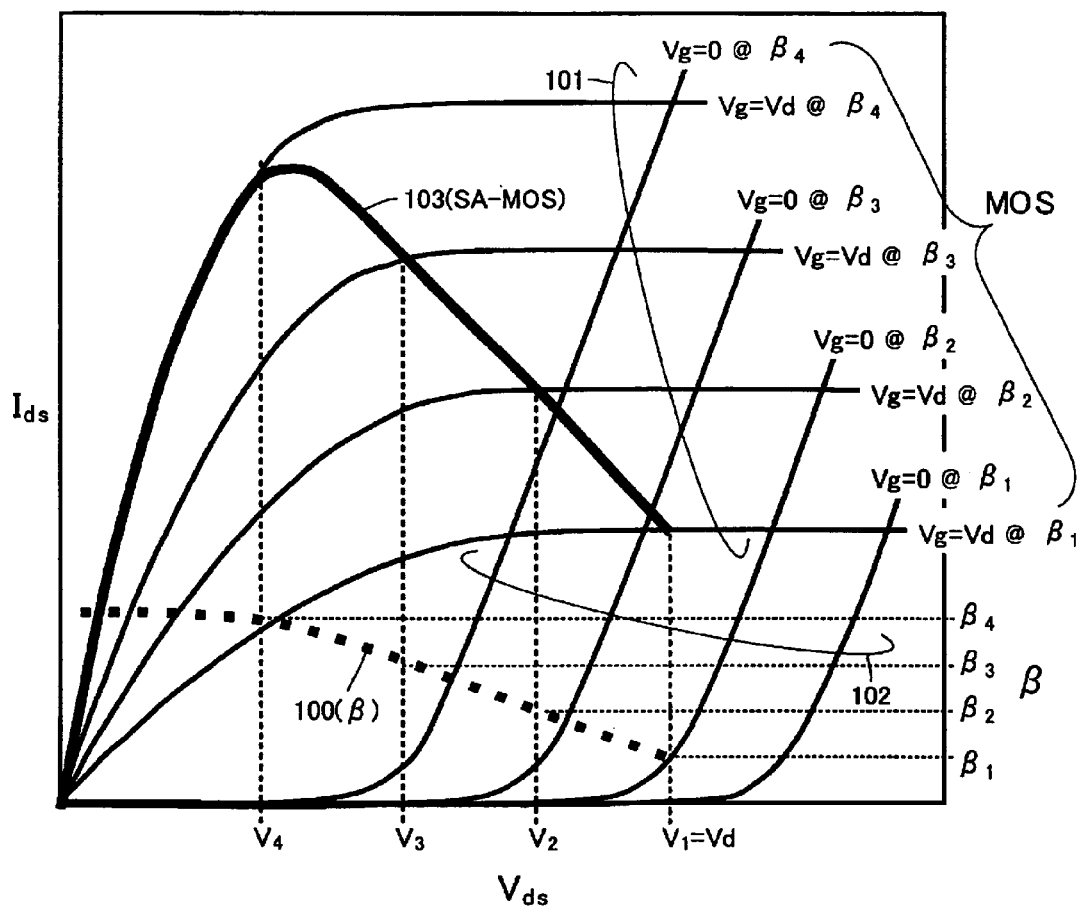
FIG. 1 shows an I–V characteristic of an SA-MOS of the present invention.

Referring now to FIGS. 1 to 5 and Tables 1 and 2, the functional principle of the SA-MOS device is described. FIG. 1 shows a source-drain current $I_{ds}$ to source-drain voltage $V_{ds}$ characteristic of the SA-MOS device.

Referring to FIG. 1, gain coefficient $\beta$ of the SA-MOS device is denoted by a reference number 100. Gain coefficient $\beta$ of the SA-MOS device changes in inversely proportional to source-drain voltage $V_{ds}$. Here, source-drain voltage $V_{ds}$ that is equal to power-supply voltage $V_d$ is set as $V_1$, the gain coefficient thereat being set as $\beta_1$.

Likewise, when $V_{ds}$ is $V_2$, $V_3$ and $V_4$, corresponding gain coefficients are $\beta_2$, $\beta_3$ and $\beta_4$, respectively. FIG. 1 shows a normal source-drain current $I_d$ to source-drain voltage $V_{ds}$ characteristic when gate voltage $V_g$ corresponding to the OFF state of the transistor is $V_d$ (in an n-type MOS, 0 in a p-type MOS), and when gate voltage $V_g$ corresponding to the OFF state of the transistor is 0 (in an n-type MOS, $V_d$ in a p-type MOS), which are denoted by reference numbers 101 and 102 respectively. Thus, the $I_{ds}$-$V_{ds}$ characteristic of the SA-MOS device is expected to show the curve denoted by a reference number 103. The $I_{ds}$-$V_{ds}$ characteristic of the SA-MOS device has a peak at almost the middle thereof with respect to the change of $V_{ds}$, which is different from the conventional MOS device.

TABLE 1

Scaling Law for SA-MOS Device

| Parameter | Vd constant proportional scaling down | √Vd proportional scaling down |
|---|---|---|
| Gate length L | 1/α | 1/α |
| Gate width W | 1/α | 1/α |
| Thickness of oxide film $T_{ox}$ | 1 | 1 |
| Junction depth $X_1$ | 1 | 1 |
| Impurity concentration N | 1 | 1 |
| Voltage Vd | 1 | 1/√α |

Table 1 indicates a scaling law for the SA-MOS device. In the SA-MOS device, only gate length L and gate width W of various parameters are reduced by a factor of 1/α. As for thickness of gate oxide film $T_{OX}$, impurity diffusion depth of source and drain $X_j$, and introduced impurity concentration N of a substrate (or a channel portion directly below the gate), are set as constant without further scaling down, in conformity to the respective limits. As for power-supply voltage $V_d$, any value lower than a certain value may be applied without specific limitation.

In Table 1, an example is indicated where $T_{ox}$, $X_j$ and N are constant, and power-supply voltage $V_d$ is either constant or reduced by a factor of $\alpha^{-0.5}$. As for power-supply voltage $V_d$, the user can arbitrarily set a value depending on the purpose of using LSI.

TABLE 2

Effects of SA-MOS Device Scaling Down

| Parameter | Vd constant proportional scaling down | √Vd proportional scaling down |
| --- | --- | --- |
| Area A ∝ LW | $1/\alpha^2$ | $1/\alpha^2$ |
| Electric field E ∝ V/T | 1 | $1/\sqrt{\alpha}$ |
| Capacitance C ∝ A/t + lw/t | $1/\alpha$ | $1/\alpha$ |
| Drain current Ids ∝ WV²/LT | 1 | $1/\alpha$ |
| Threshold voltage | 1 | 1 |
| Signal delay time T ∝ CV/I | $1/\alpha$ | $1/\sqrt{\alpha}$ |
| Power consumption P ∝ IV | 1 | $1/\alpha^{1.5}$ |
| Power density P/A | $\alpha^2$ | $\sqrt{\alpha}$ |

Table 2 indicates the effects of miniaturization of the device according to the scaling law of the SA-MOS device indicated in Table 1. When power-supply voltage $V_d$ is constant, signal delay time is reduced to $1/\alpha$, so that increase in the speed of LSI can be expected by device miniaturization.

In such a case, however, caution is required not to reduce power consumption. When power-supply voltage $V_d$ is reduced by a factor of $\alpha^{-0.5}$, on the other hand, signal delay time is reduced to $\alpha^{-0.5}$, resulting in less increase in the speed of LSI by device miniaturization, while however an effect can be expected that power consumption is reduced by a factor of $1/\alpha^{1.5}$.

Figure 2:
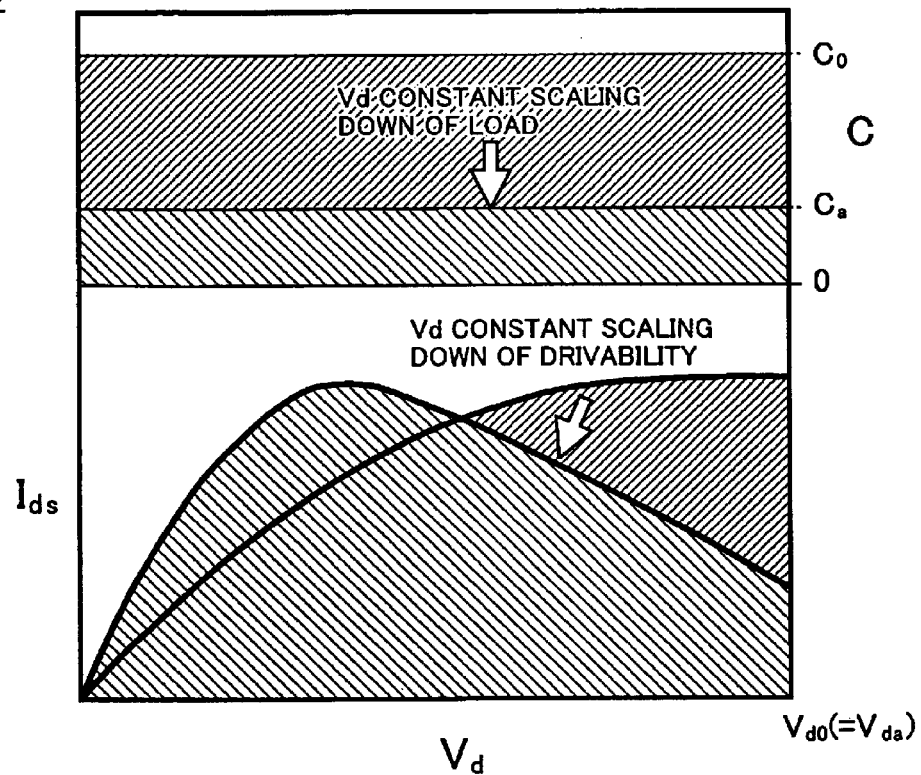
FIG. 2 shows a relationship between the drivability and the load of the SA-MOS, associated with constant reduction of power-supply voltage $V_d$.
Figure 3:
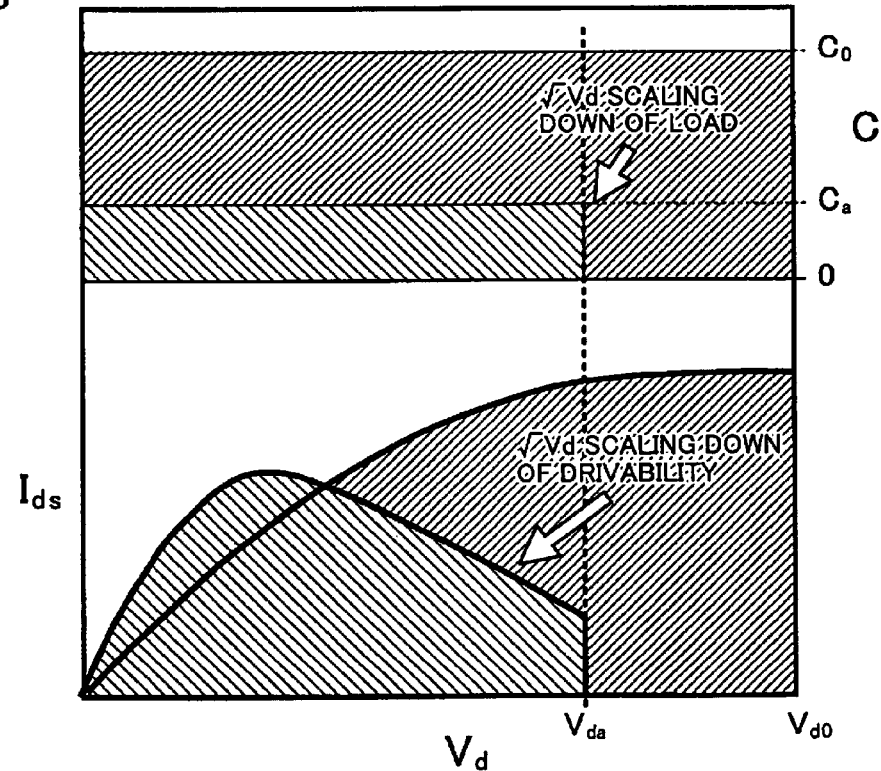
FIG. 3 shows the relationship between the drivability and the load of SA-MOS, associated with reduction of power-supply voltage $V_d$ by a factor of $\alpha^{-0.5}$.

Such effects related to the scaling law of the SA-MOS device will be described with reference to FIGS. 2 and 3. FIGS. 2 and 3 show changes in the drivability and the load associated with device miniaturization, by areas, FIG. 2 showing an example where power-supply voltage $V_d$ is constant, FIG. 3 showing an example where power-supply voltage $V_d$ is reduced by a factor of $\alpha^{-0.5}$. When power-supply voltage $V_d$ is constant as shown in FIG. 2, the drivability has little change as the device is reduced, further increasing the area ratio to the load which decreases with scaling-down. This means that the power consumption is constant whereas the operation speed increases. When power-supply voltage $V_d$ is reduced by a factor of $\alpha^{-0.5}$ as shown in FIG. 3, the drivability is somewhat lowered but yet the load also decreases, so that higher performance in both the power consumption and the operation speed can be expected.

Figure 4:
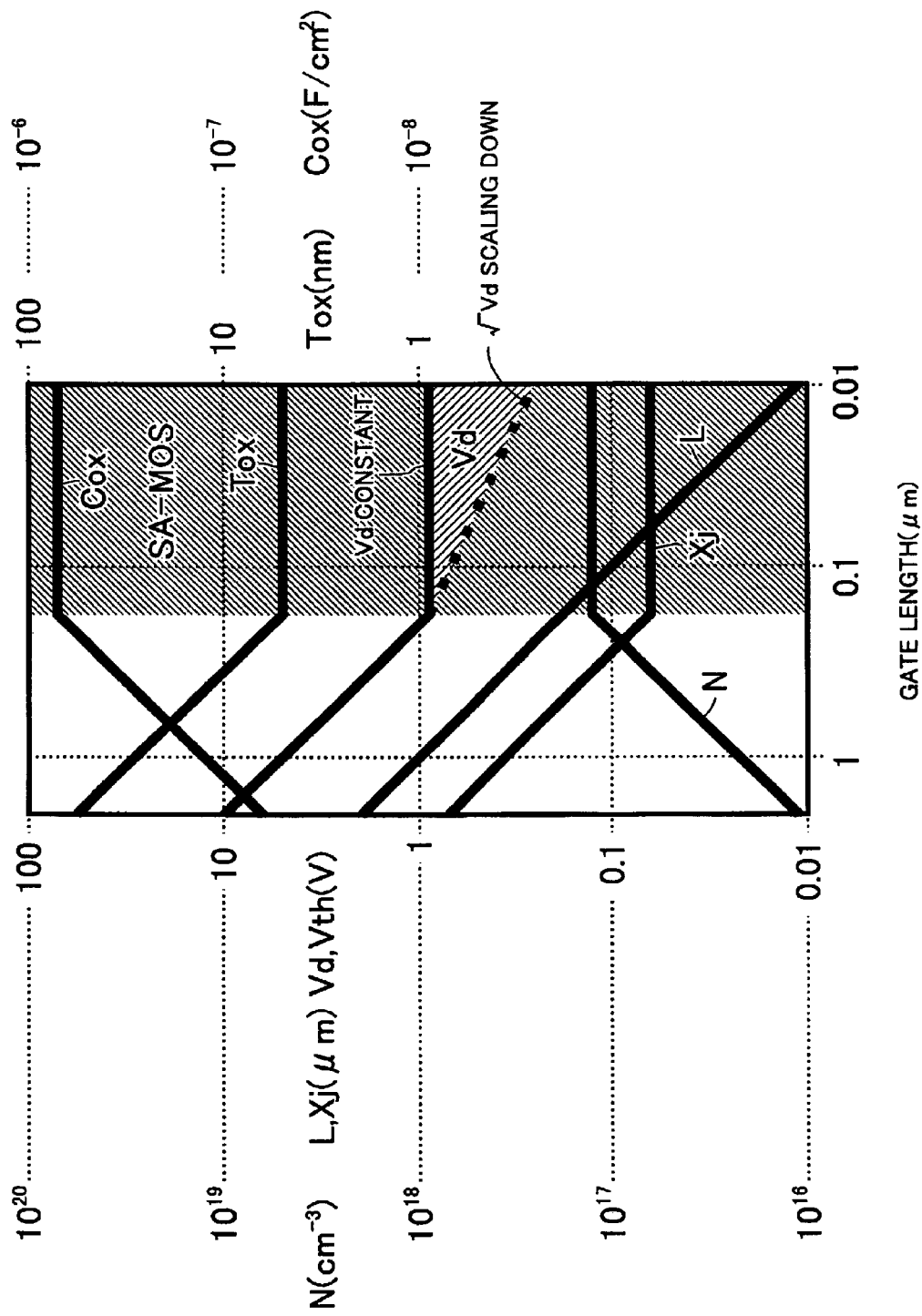
FIG. 4 shows a trend of miniaturization of a semiconductor device of the present invention.
Figure 5:
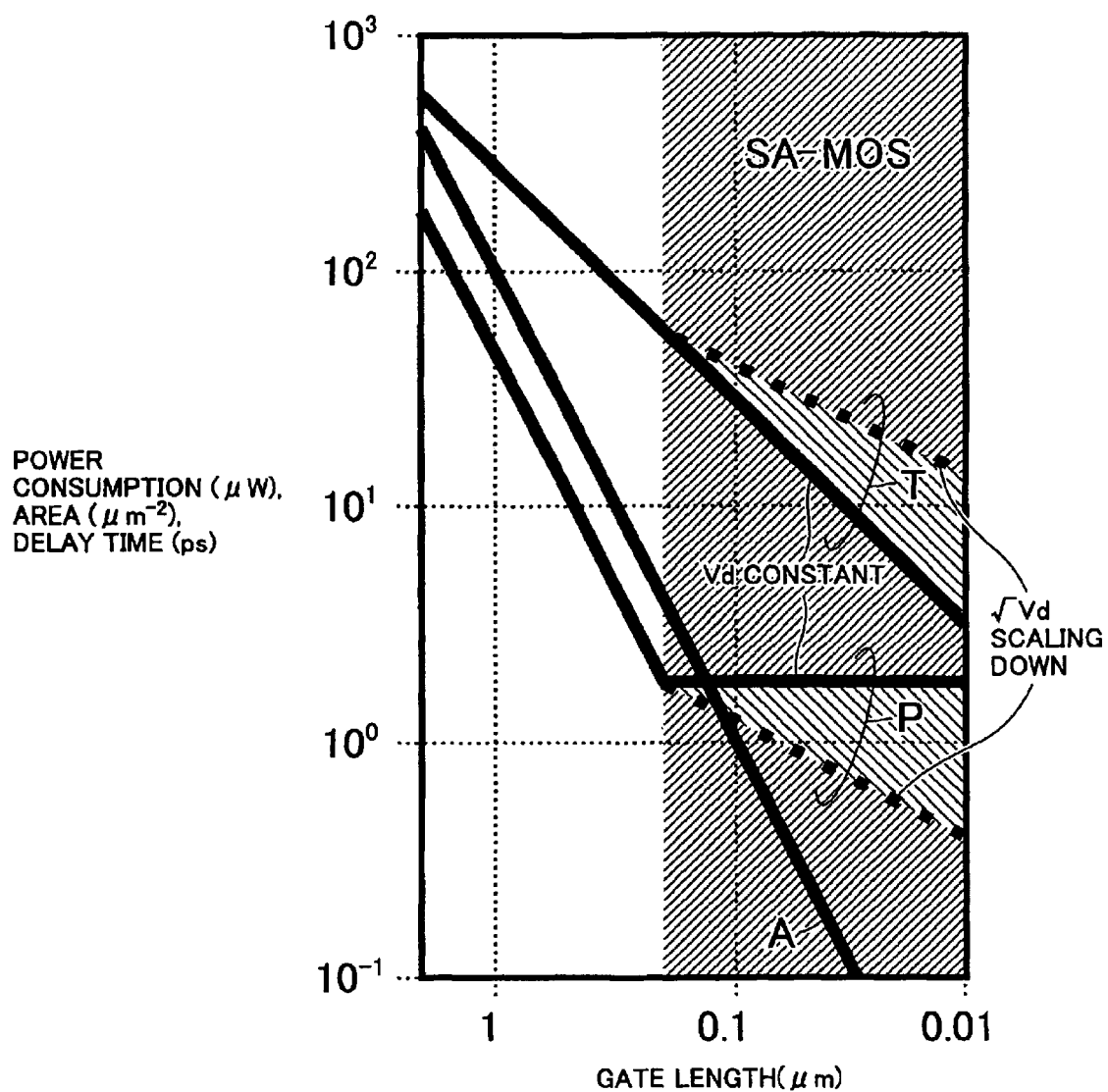
FIG. 5 shows a trend of the LSI performance, associated with miniaturization of the semiconductor device of the present invention.

The description above in regard to the reduction rule of the MOS device according to the present invention is summarized in FIG. 4. The conventional constant electric-field scaling law is applied to gate length L of a value approximately higher than 0.12 μm, whereas the reduction rule for the SA-MOS device of the present invention can be applied to a scale with gate length L of approximately 0.12 μm or shorter.

Power-supply voltage $V_d$ is herein reduced to a certain value or lower, which may be set as desired by the user. According to the scaling law of the device, the trend of the LSI performance shown in FIG. 5 can be expected. As for signal delay time T and power consumption P in FIG. 5, the characteristic of complimentary variation in accordance with power-supply voltage $V_d$ is expected. Thus, the power-supply voltage of LSI may be set by giving priority to the power consumption or to the operation speed.

The power-supply voltage of LSI may also be set during the operation of LSI, allowing dynamic control of the power consumption and operation speed in accordance with device environment or process condition, to always realize optimal performance.

Furthermore, a characteristic may also be provided that modulates gain coefficient β in accordance with the gate voltage. That is, when the gate voltage is high, the effective gate length is shortened to increase gain coefficient β, whereas the effective gate length may be increased as the gate voltage is lowered, and may be set to the maximum during the OFF state of the transistor to increase the withstand voltage. However, the semiconductor device with such a structure may be applied only to a CMOS (Complementary-MOS) logic circuit.

First Embodiment

Figure 6:
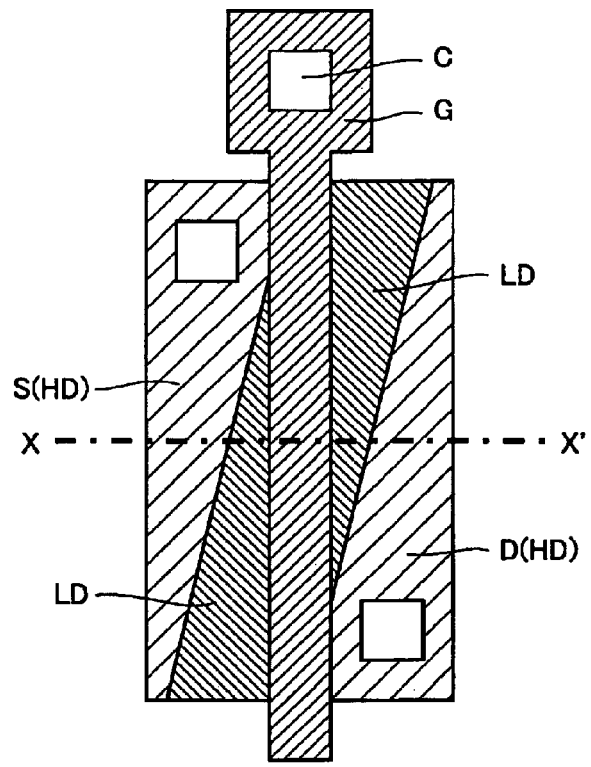
FIG. 6 is a plan view showing a configuration example of a semiconductor device according to the first embodiment of the present invention.

An embodiment of a device configuration for realizing the function of an SA-MOS device of the present invention will now be described with reference to FIGS. 6 to 9. FIG. 6 shows an example of a basic structure of the SA-MOS device of the present invention. The structural characteristic of the SA-MOS device of the present invention is that a lightly-doped impurity diffusion region LD forming a certain angle with respect to an MOS gate G is additionally provided.

The "lightly-doped" here means that the impurity concentration is lower compared to that of a heavily-doped impurity diffusion region HD of source S and drain D. As shown in FIG. 6, lightly-doped impurity diffusion region LD substantially forms a triangle between a normal MOS gate G and source S or drain D, and these regions surrounding the MOS gate substantially forms a quadrangle. Lightly-doped impurity diffusion region LD is not necessarily required to have a shape of a triangle, and any shape that forms asymmetry between source S and drain D with respect to the gate may be adopted. In FIG. 6, C denotes a contact hole.

Figure 7:
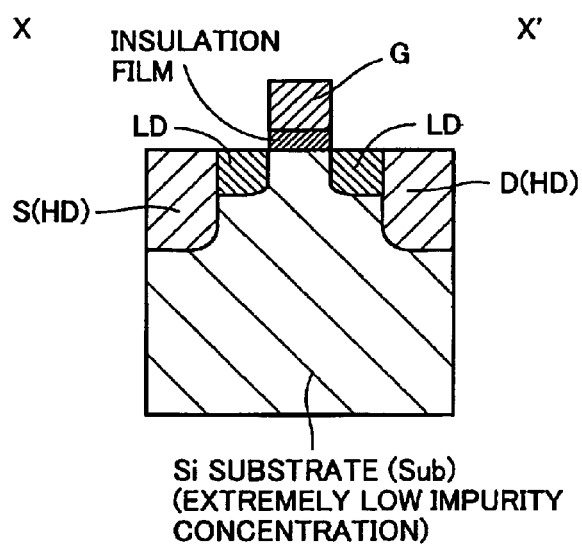
FIG. 7 is a vertical section view showing a configuration example of the semiconductor device according to the first embodiment of the present invention.

FIG. 7 shows a vertical section taken along X—X' in FIG. 6. As shown in FIG. 7, lightly-doped impurity diffusion region LD is formed to be shallower than impurity diffusion regions HD of source S and drain D.

The SA-MOS device utilizes such a characteristic that the resistance value of lightly-doped impurity diffusion region LD formed between MOS gate G and drain D changes in accordance with drain voltage $V_{ds}$, to modulate the direction of the electric field between the source and drain that is applied to the channel below the MOS gate, realizing automatic modulation of gain coefficient β by changing effective gate length and gate width. In the lightly-doped impurity diffusion region LD formed between the gate G and drain β in the SA-MOS, the width of a depletion layer formed between the region and the substrate (backgate) increases as drain voltage $V_{ds}$ becomes higher, as shown in FIG. 8B, the resistance thereat being high.

Figure 8A:
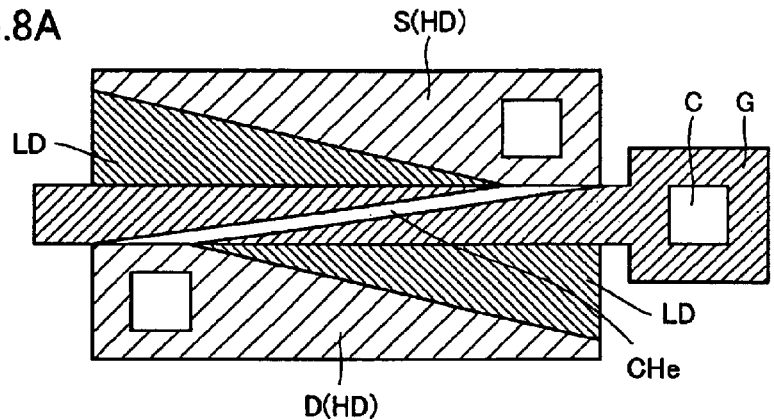
FIGS. 8A and 8B are, respectively, a plan view and a vertical section illustrating a modulation mechanism of a gain coefficient β of the semiconductor device according to the first embodiment, in the case of a high source-drain voltage $V_{ds}$.
Figure 8B:
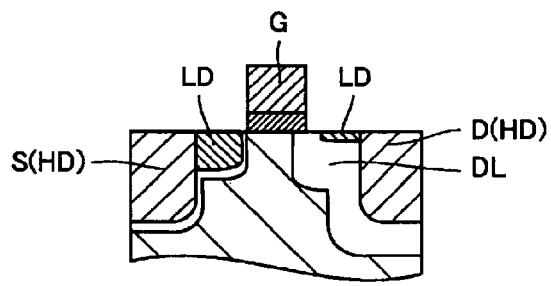

As a result, the direction of the electric field between the source and drain that is applied to the channel below the MOS gate gradually inclines with respect to the channel direction along the minimum gate length, increasing the length of effective gate channel $CH_e$ and reducing gain coefficient β, as shown in FIG. 8A.

Figure 9A:
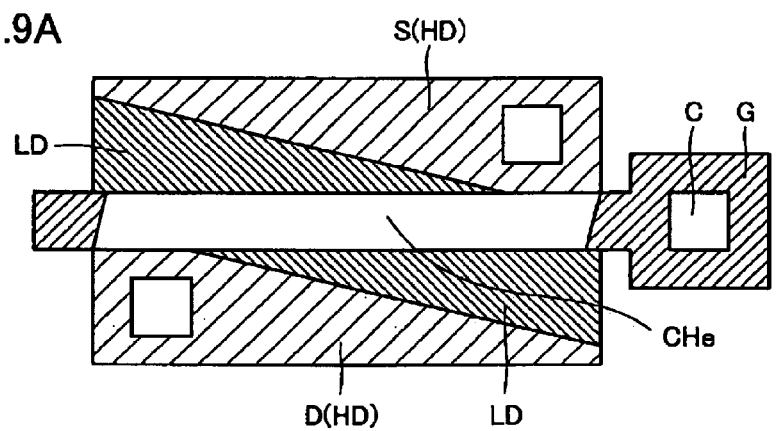
FIGS. 9A and 9B are, respectively, a plan view and a vertical section illustrating a modulation mechanism of gain coefficient β of the semiconductor device according to the first embodiment, in the case of a low source-drain voltage $V_{ds}$.

On the contrary, when drain voltage $V_{ds}$ is lowered, the width of depletion layer DL formed between the impurity diffusion region and the substrate (backgate) is made smaller, reducing the resistance value thereat. As a result, the direction of the electric field between the source S and drain D that is applied to the channel below the MOS gate is gradually inclined with respect to the channel direction along the minimum gate length, reducing the length of effective gate channel $CH_e$ and increasing gain coefficient $\beta$, as shown in FIG. 9A.

Therefore, the SA-MOS device realizes automatic modulation of gain coefficient $\beta$ that is inversely proportional to drain voltage $V_{ds}$ by relatively lightly-doped impurity diffusion region LD formed between its MOS gate G and drain D.

If the effective gate length when drain voltage $V_{ds}$ is equal to power-supply voltage $V_d$ is a value sufficient to ensure the withstand voltage, accurate operation as a switch can be expected. The smaller the gate length of the limit for processing is, the larger the value of the maximum gain coefficient $\beta$ can be set, while the minimum gate length is assumed to be at least approximately 20 nm because of the limit for suppression of tunnel current in the channel direction. Application of the SA-MOS device structure of the present invention allows miniaturization of the device to have a gate length in the range between approximately 0.12 $\mu$m and 0.02 $\mu$m. Thus, the effect of maintaining the trend of increase in LSI performance to some degree can be expected.

Second Embodiment

Figure 10:
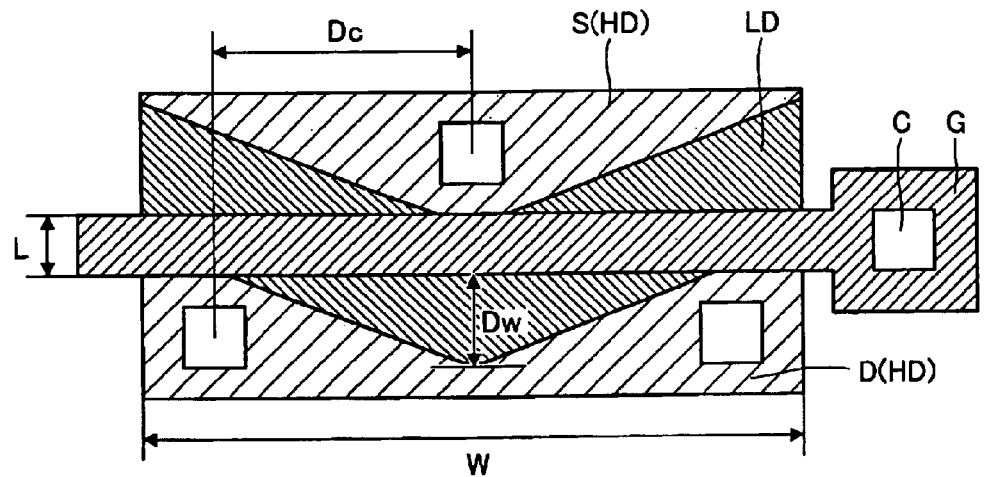
FIG. 10 is a plan view showing a configuration example of a semiconductor device according to the second embodiment of the present invention.

FIG. 10 shows a configuration example of an SA-MOS device according to the second embodiment of the present invention. In the second embodiment, an asymmetric lightly-doped impurity diffusion region is formed by bending the region of the shape shown in FIG. 6 (first embodiment). As such, the lightly-doped impurity diffusion region may be any shape that is asymmetric between the source and drain. Such a structure according to the second embodiment is effective in the device having a large gate width W.

The characteristic of automatic modulation of gain coefficient $\beta$ in the SA-MOS device is determined by the resistance value of the lightly-doped impurity diffusion region between the gate and source-drain and the degree of modulation by drain voltage $V_{ds}$, i.e., is determined by the relative shape, length, depth and impurity concentration of the MOS gate and the lightly-doped impurity diffusion region, indicated by $D_c$, $D_w$, and the like in FIG. 10.

Third Embodiment

Figure 11:
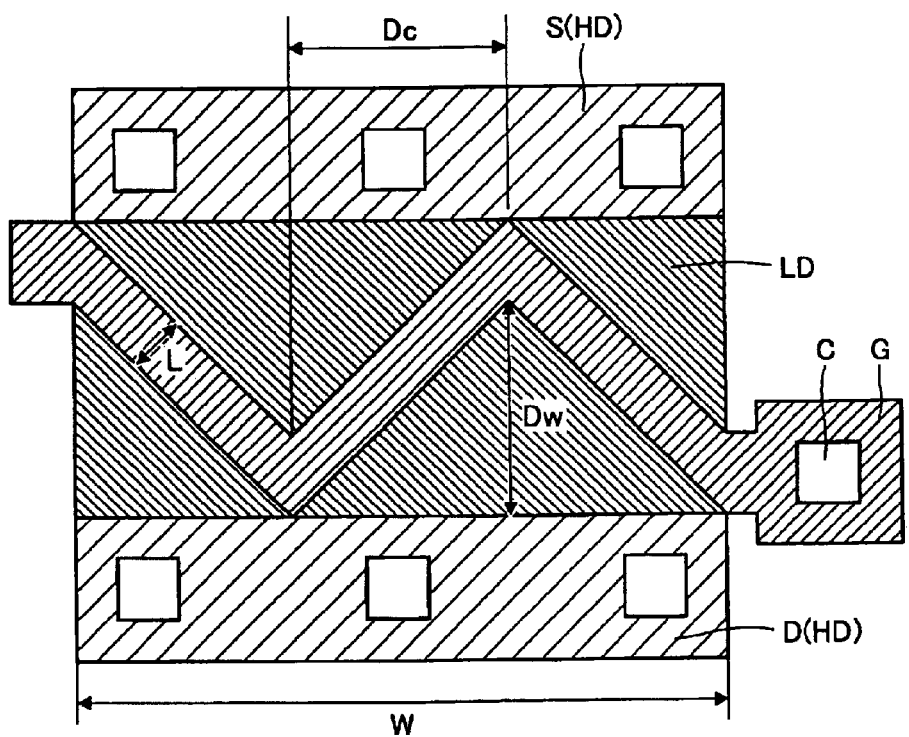
FIG. 11 is a plan view showing a configuration example of a semiconductor device according to the third embodiment of the present invention.

FIG. 11 shows a configuration example of an SA-MOS device according to the third embodiment of the present invention. In the third embodiment, an asymmetric lightly-doped impurity diffusion region is realized by bending the gate. The structure according to the third embodiment is effective in the device having a large gate width W and yet large $D_w$. In this embodiment, the characteristic of automatic gain modulation of the SA-MOS device is also determined by the depth and impurity concentration of the lightly-doped impurity diffusion region, indicated by $D_c$, and $D_w$, in FIG. 11.

Fourth Embodiment

Figure 12A:
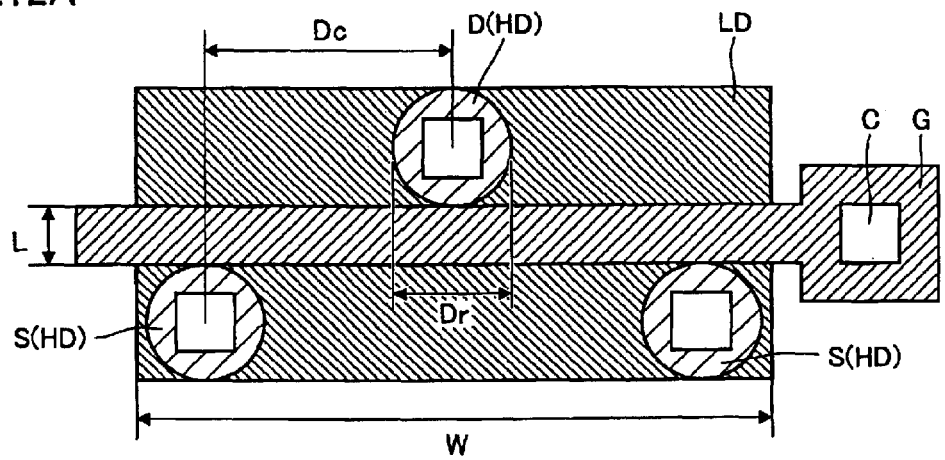
FIGS. 12A and 12B are plan views showing a configuration example of a semiconductor device according to the fourth embodiment of the present invention.
Figure 12B:
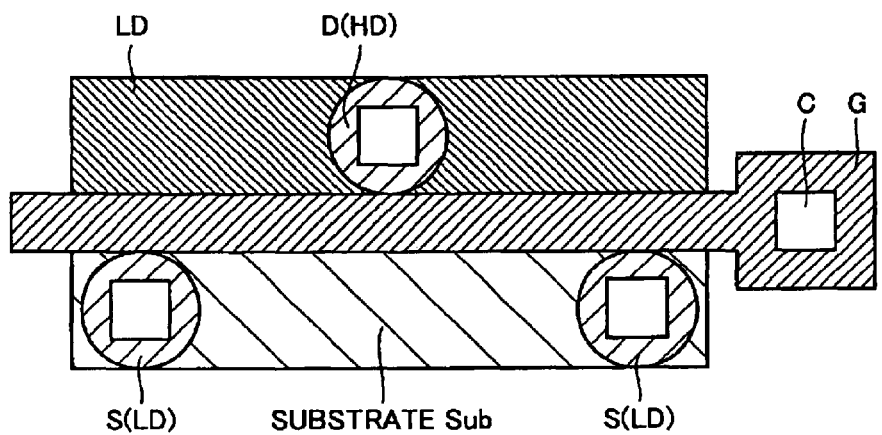

FIGS. 12A and 12B show a configuration example of an SA-MOS device according to the fourth embodiment of the present invention. In the fourth embodiment, heavily-doped impurity diffusion (HD) is applied to regions corresponding to actual source S and drain D only in the vicinity of contacts C that are asymmetrically arranged at source S and drain D respectively, and the other region is formed as lightly-doped impurity diffusion region LD. Moreover, as shown in FIG. 12B, the source S side is left having the impurity concentration of the substrate (or well), without an impurity diffusion region formed except for the vicinity of contact C. As in the present embodiment, lightly-doped impurity diffusion region LD may be any shape that is asymmetric between source S and drain D.

According to the present embodiment, various diffusion regions may easily be formed and the withstand voltage at a high drain voltage $V_{ds}$ can be increased.

The characteristic of automatic gain modulation of the SA-MOS device in the present embodiment is determined by the resistance value of the lightly-doped impurity diffusion region and the degree of modulation by drain voltage $V_d$, i.e., by the shape, depth and impurity concentration of the lightly-doped impurity diffusion region specified by $D_c$, $D_r$ and the like shown in FIG. 12A.

Fifth Embodiment

FIG. 13 shows a miniaturization rule related to the shape of a lightly-doped impurity diffusion region in an SA-MOS device. FIG. 13 (a) shows the conventional MOS device, having the gate length of approximately 0.12 $\mu$m. Here, to reduce the gate length to be approximately 0.12 $\mu$m or shorter, the SA-MOS device structure is used. FIGS. 13 (b) and (c) each shows an example of a reduced SA-MOS device. An example of miniaturization according to the fifth embodiment is shown in FIG. 13, in which (b) shows a device reduced to a scale of 0.8 times the device of (a), and (c) shows a device reduced to a scale of 0.2 times the device of (a).

When miniaturization proceeds in the SA-MOS device, a method is considered for determining the shape of the lightly-doped diffusion region under the condition that the minimum distance between the contacts at the source and drain is approximately made constant. This condition is set based on the fact that the effective gate length, which should be maximum when drain voltage $V_{ds}$ is equal to power-supply voltage $V_d$, corresponds to the minimum distance between the contacts at the source and drain, and is required to ensure a withstand voltage that can block current during the OFF state of the transistor, when the power-supply voltage is made constant. When the power-supply voltage is reduced, however, the minimum distance between the contacts at the source and drain can be reduced accordingly. A similar reduction rule can also be applied to the fourth embodiment shown in FIGS. 12A and 12B.

Sixth Embodiment

In the sixth embodiment, it will be described that an SA-MOS device can be utilized in any logic circuits as in the case with the conventional MOS device.

Figure 14:
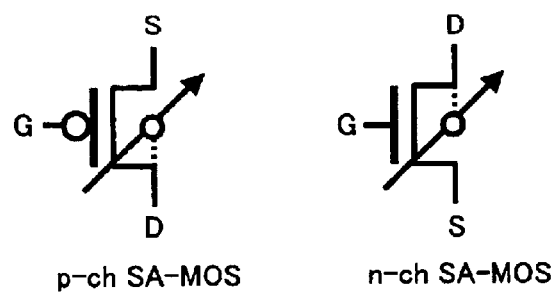
FIG. 14 shows an example of symbols representing the semiconductor devices according to the first to fifth embodiments of the present invention.
Figure 15:
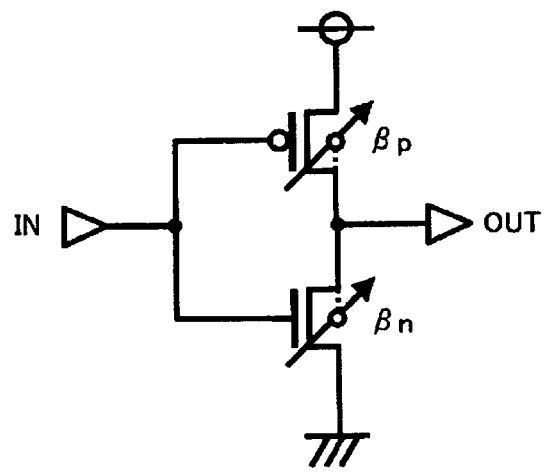
FIG. 15 is a circuit diagram showing an example of a logic circuit using a semiconductor device of the present invention, according to the sixth embodiment.

The SA-MOS device includes two types of channels, i.e. p-type and n-type, as in the MOS transistor, the respective symbols thereof shown in FIG. 14. FIG. 15 shows an example of an inverter circuit constituted by an SA-MOS device. This circuit is structured only by replacing the p-type and n-type MOS transistors in the conventional CMOS logic circuit by those of the SA-MOS device, i.e., requiring no circuit change. As well as the inverter, any logic circuits may be formed by the SA-MOS device.

Figure 16:
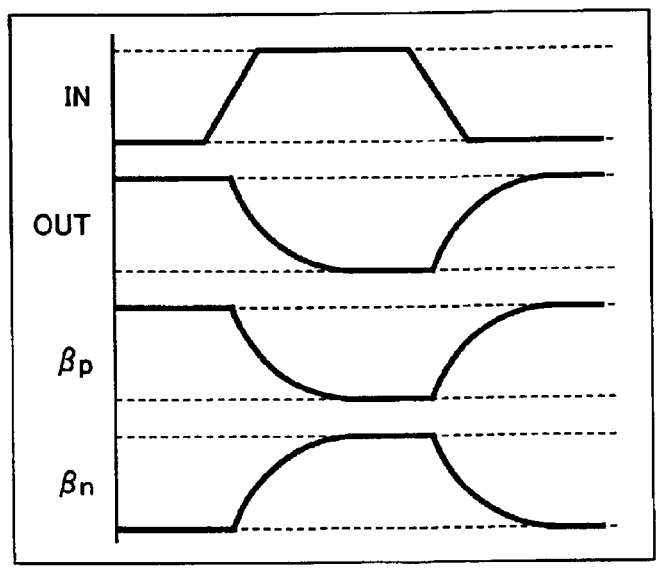
FIG. 16 illustrates waveforms indicating operation of the logic circuit configuration shown in FIG. 15.

The operation of the SA-MOS logic circuit is now described. Each SA-MOS device has a characteristic in that gain coefficient $\beta$ is modulated in inversely proportional to its source-drain voltage $V_{ds}$. FIG. 16 shows the signal level at each node and a change with respect to time in gain coefficient $\beta$ of each SA-MOS device in the circuit shown in FIG. 15. At an output node OUT, an inversion signal of an input signal appears through a delay time determined by the load capacitance of the output node and the drivability of the transistor.

At each SA-MOS device, modulation of gain coefficient β is realized that is inversely proportional to its source-drain voltage $V_{ds}$. By dynamically optimizing gain coefficient β that is inversely proportional to source-drain voltage $V_{ds}$, each SA-MOS device can bring out effective drivability. Therefore, such circuit operation allows each SA-MOS device to realize dynamic application in which the gate length of the device is substantially miniaturized as source-drain voltage $V_{ds}$ decreases so that source-drain current $I_{ds}$ is increased, and to realize increase in the speed of the logic circuit by device miniaturization.

Thus, the SA-MOS device of the present invention is applicable to a large number of conventional LSI circuits, and can greatly contribute to a wide range of LSI in terms of further improvement of integration, increase of speed, and reduction of power consumption.

Seventh Embodiment

Another example of a circuit configuration for which an effect can be expected that is similar to that of the logic circuit structure according to the SA-MOS device of the present invention. In the present embodiment, the circuit is configured using Adjustable β MOS (abbreviated as A-MOS) that was previously proposed by the applicant. First, the outline of A-MOS is described.

Figure 17:
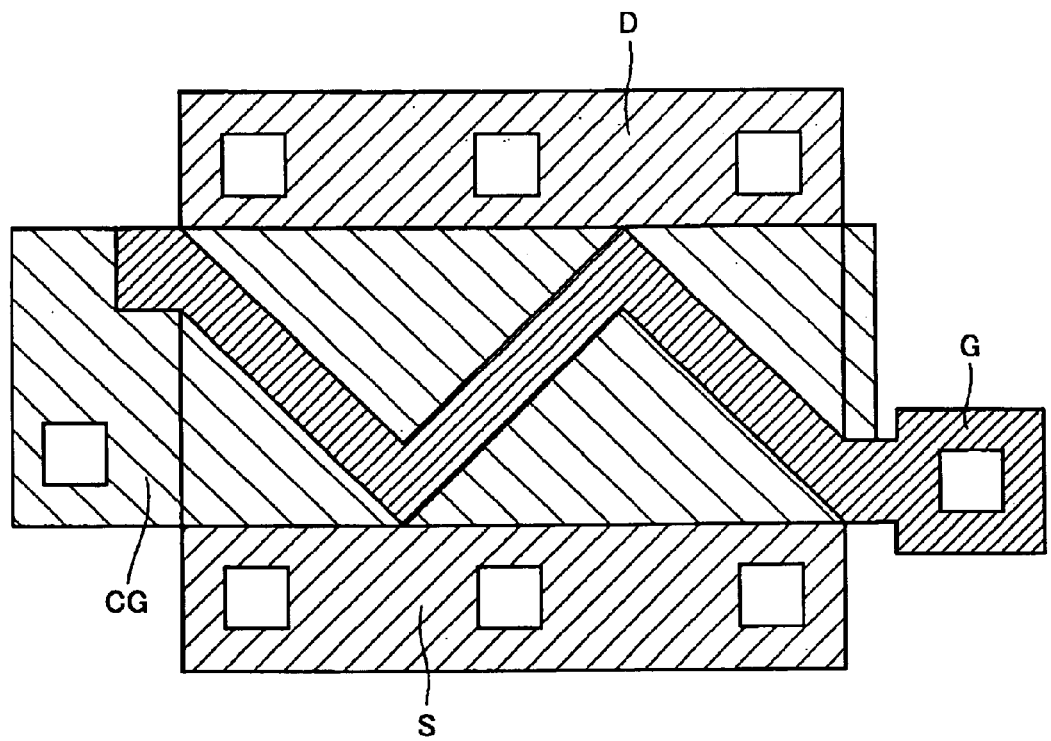
FIG. 17 is a plan view showing a configuration example of a semiconductor device according to the seventh embodiment of the present invention.

FIG. 17 shows a basic structure of the A-MOS device. The structural characteristic of the A-MOS device is that a control gate CG forming a certain angle with respect to a normal MOS gate is additionally provided. Control gate CG may be formed to be superposed on the MOS gate using a layer different from the MOS gate, as shown in FIG. 17. The channel portion below the control gate may be independently adjustable for its channel conductance by changing the impurity concentration of the channel to that of the MOS gate portion. The basic structure of A-MOS is characterized in that a control gate region substantially forms a triangle between the normal MOS gate and the source or drain, and these regions surrounding the MOS gate substantially forms a quadrangle.

Figure 18:
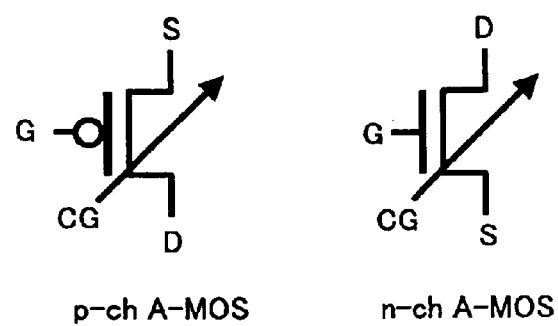
FIG. 18 shows an example of symbols used for the semiconductor device according to the seventh embodiment of the present invention.

A-MOS modulates the direction of an electric field applied to the channel below the MOS gate, i.e. the electric field between the source and drain, by controlling the resistance value of the channel below the control gate, in accordance with the voltage value of the control gate, and thus changes the effective gate length and gate width, enabling voltage control by gain coefficient β. As in SA-MOS, the A-MOS device also has two types of channels, i.e. p-type and n-type, the symbols of which are shown in FIG. 18.

Figure 19:
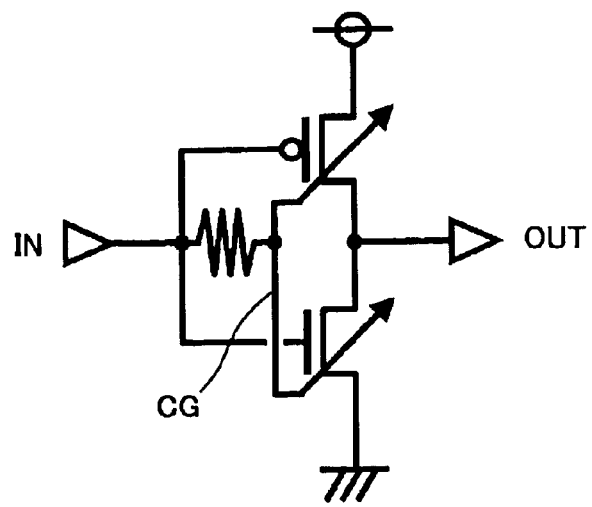
FIG. 19 is a circuit diagram showing an example of a logic circuit using the semiconductor device according to the seventh embodiment.

FIG. 19 shows an example of an inverter circuit configured by an A-MOS device. This circuit is structured by replacing the p-type and n-type MOS transistors in the conventional CMOS logic circuit by p-type and n-type A-MOS and inserting a resistance between the control gate of A-MOS and an input node. As well as the inverter, any logic circuits may be formed by the A-MOS device. Such a configuration of the A-MOS circuit allows each A-MOS transistor to realize a characteristic in that gain coefficient β is modulated in inversely proportional to source-drain voltage $V_{ds}$.

Figure 9B:
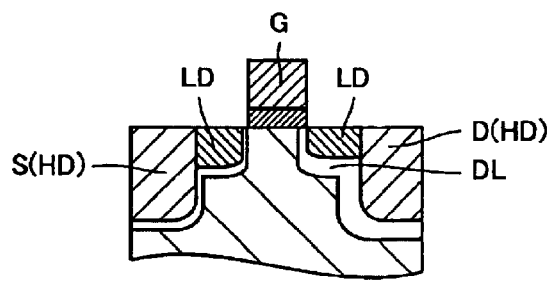
Figure 20:
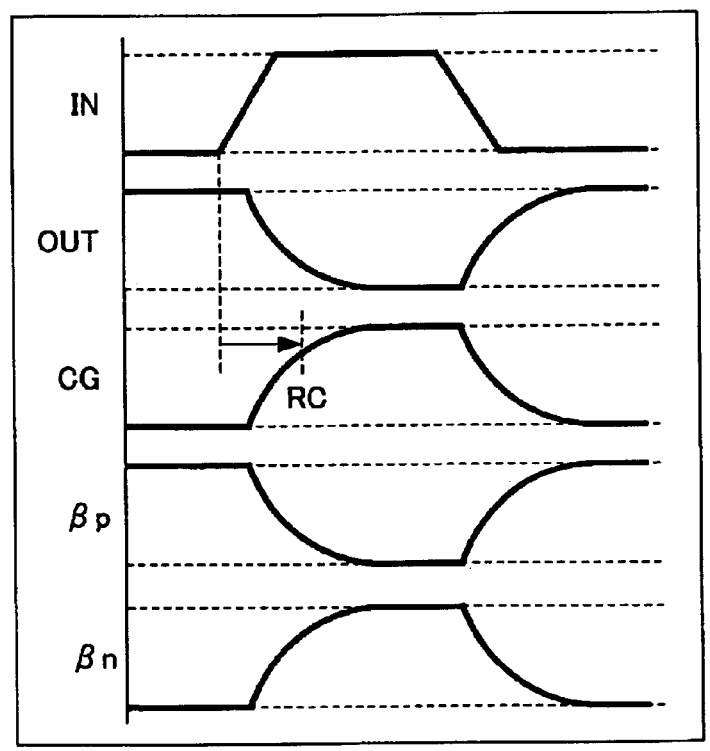
FIG. 20 shows waveforms indicating the operation of the logic circuit configuration shown in FIG. 19.

FIG. 20 shows a signal level at each node and a change with respect to time in gain coefficient β of each A-MOS transistor in the circuit shown in FIG. 9.

At an output node OUT, an inversion signal of an input signal appears through a delay time determined by the load capacitance of the output node and the drivability of the transistor, i.e., by a load-drivability characteristic.

A control gate CG of each A-MOS connected to the input node via the resistance has the same voltage level as that of the input signal after a delay time proportional to the resistance value and the capacitance of the control gate. Here, an example is shown in which the resistance value of the resistance inserted between the input and the control gate is adjusted such that a delay in the control gate signal is the same as a delay in the output signal. As a result, each A-MOS transistor can realize modulation of gain coefficient β that is in inversely proportional to each source-drain voltage $V_{ds}$. Thus, the circuit configuration described above using an A-MOS device also has an effect similar to that in the case with the SA-MOS device.

Eighth Embodiment

FIG. 21 shows a circuit configuration according to the eighth embodiment, in which the resistance value of the resistance inserted between the input node and the control gate node is set to substantially zero in the logic circuit according to the seventh embodiment (FIG. 19) where the A-MOS device is used. The operation of the logic circuit according to the eighth embodiment shown in FIG. 21 turns out to be similar to that of the logic circuit according to the seventh embodiment shown in FIG. 19.

The circuit configuration shown in FIG. 21 is substantially equivalent to the state where gate G is connected to control gate CG in the A-MOS device. Electrical connection between the gate and the control gate of the A-MOS device forms an MOS device that automatically modulates its gain coefficient β in proportional to gate voltage $V_g$. The new MOS device that has the gate and the control gate of the A-MOS device connected together is hereinafter referred to as Merged gate-Adjusting β MOS (abbreviated as MA-MOS), meaning that the gate and the control gate are merged together. The symbols thereof are shown in FIG. 22.

Figure 23:
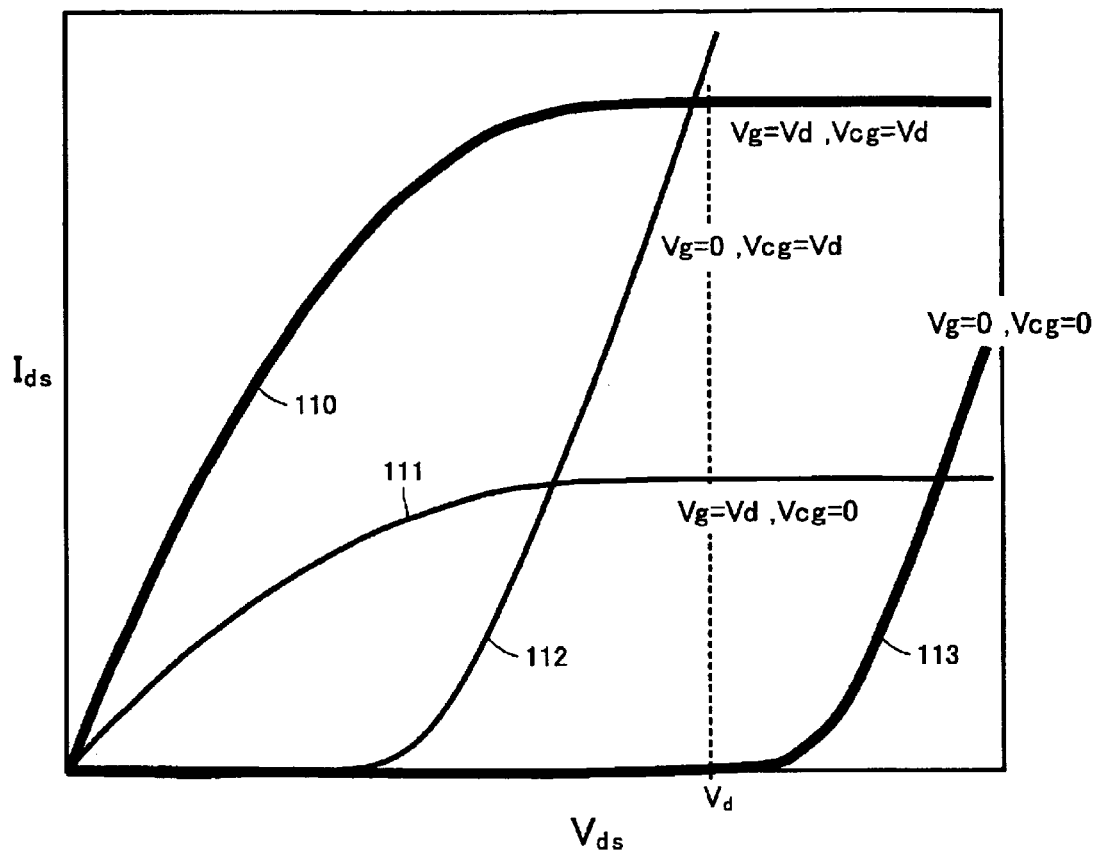
FIG. 23 shows the I–V (current-voltage) characteristic of the semiconductor device according to the eighth embodiment of the present invention.

A source-drain current $I_{ds}$ to source-drain voltage $V_{ds}$ characteristic of MA-MOS will be described. FIG. 23 shows $I_{ds}$-$V_{ds}$ characteristics 110 to 113 of A-MOS in four cases where gate voltage $V_g$ and control gate voltage $V_{cg}$ are 0 and $V_d$ respectively (in the n-type, vice versa in the p-type) when the conductance below the control gate is sufficiently higher than the conductance below the gate in the MA-MOS. Gain coefficient β increases when control gate voltage $V_{cg}$ is $V_d$, whereas it decreases when control gate voltage $V_{cg}$ is 0. On the contrary, the withstand voltage decreases when control gate voltage $V_{cg}$ is $V_d$, whereas it increases when control gate voltage $V_{cg}$ is 0.

Since the gate and control gate are connected with each other in the MA-MOS device, gate voltage $V_g$ is equal to control gate voltage $V_{cg}$, showing characteristic 110 indicated in FIG. 23. As a result, a characteristic can be realized with a high withstand voltage and high gain coefficient β during the ON state of the transistor. In the MA-MOS device, however, gain coefficient β is modulated irrespective of the voltage between the source and drain, which requires such a circuit configuration that the voltage between the source and drain is always low when the transistor is ON. A circuit in which the voltage between the source and drain is high during the ON state of the transistor cannot maintain the withstand voltage, possibly causing excessive through current to flow therein. Accordingly, the MA-MOS device is only applicable to a CMOS logic circuit.

Ninth Embodiment

Figure 24:
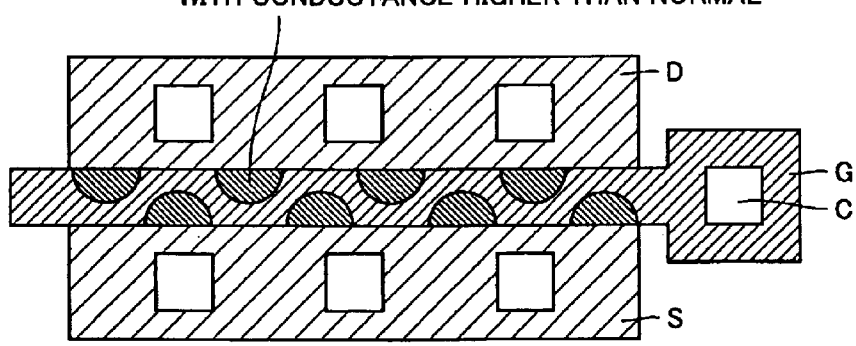
FIG. 24 is a plan view showing a configuration example according to the ninth embodiment, of the structure of the semiconductor device according to the eighth embodiment.

FIG. 24 shows a configuration example of an MA-MOS device according to the ninth embodiment. The configuration according to the ninth embodiment has a characteristic in that a region having a relatively high conductance with respect to a part of the gate is formed to be asymmetric to the source and drain. The channel portion between the source and drain, however, must always have a portion with a normal conductance.

Furthermore, in order to rapidly increase gain coefficient β when the gate voltage is high, it is desired to increase the conductance of the relatively high conductance portion as much as possible while the effective gate width of the channel portion with the normal conductance is increased. This is performed under the limitation that a withstand voltage to completely block the current is maintained when the transistor is turned off.

Figure 25:
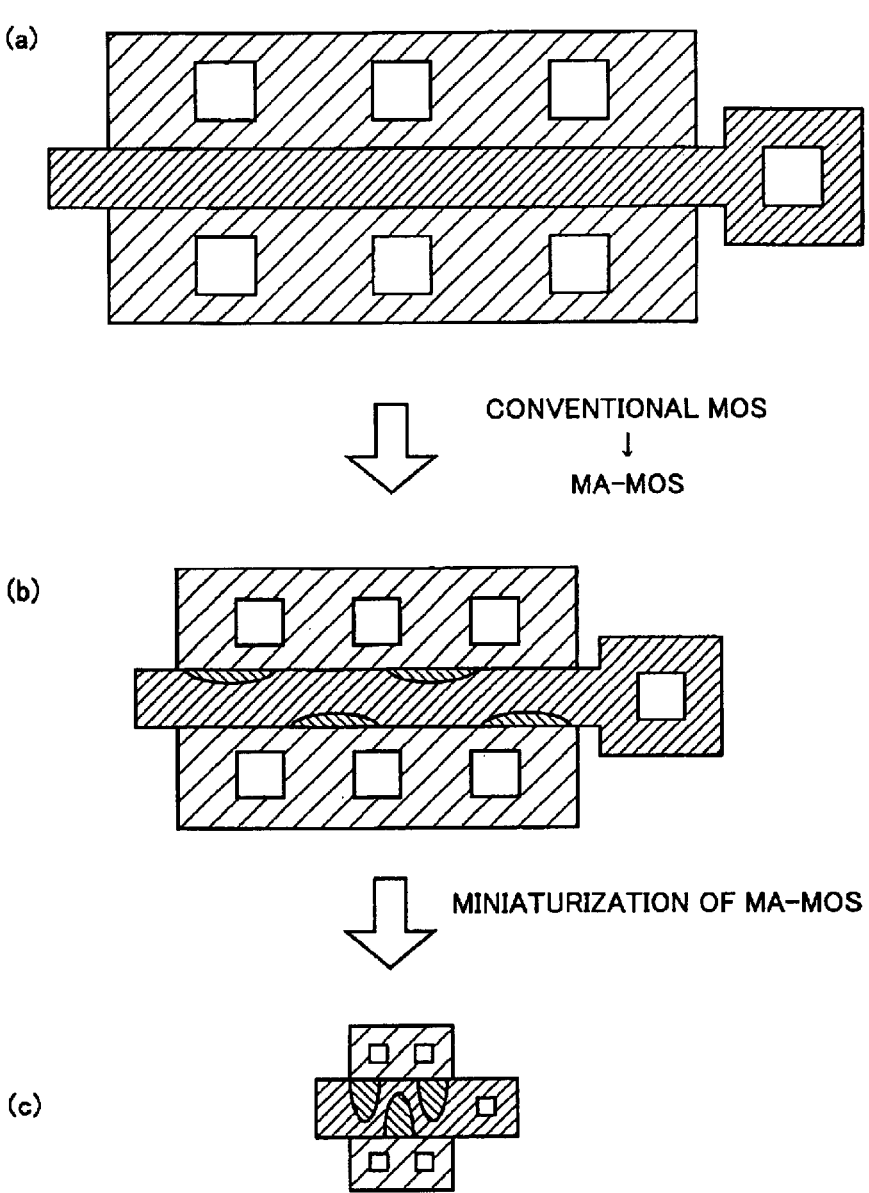
FIG. 25 is a plan view showing an example of miniaturization in the semiconductor device according to the eighth embodiment.
Figure 26:
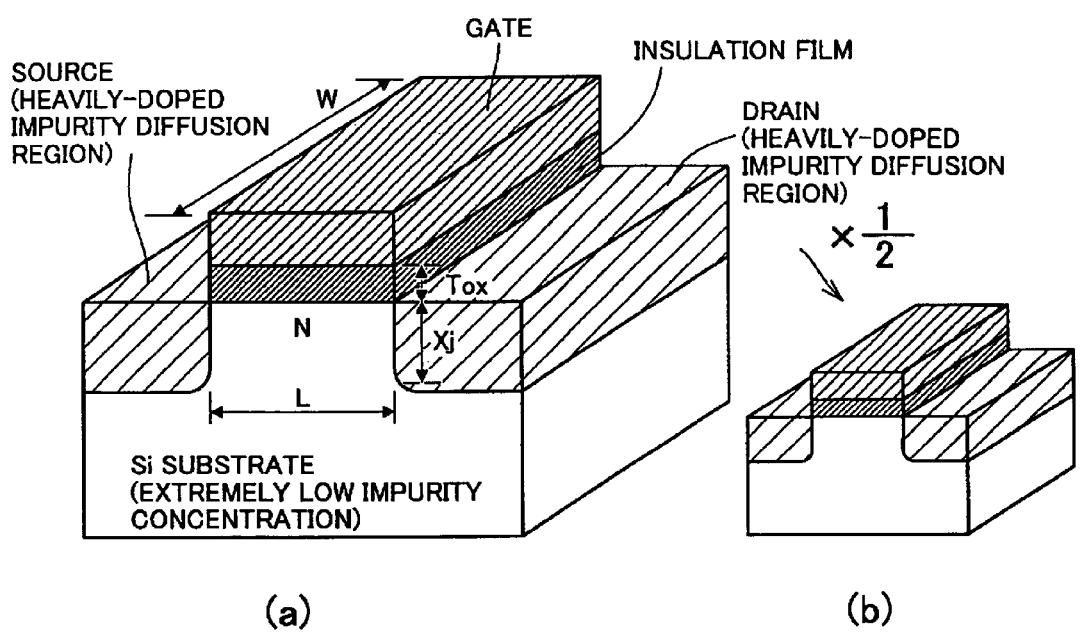
FIG. 26 is a perspective view showing an example of miniaturization in the conventional semiconductor device.
Figure 27:
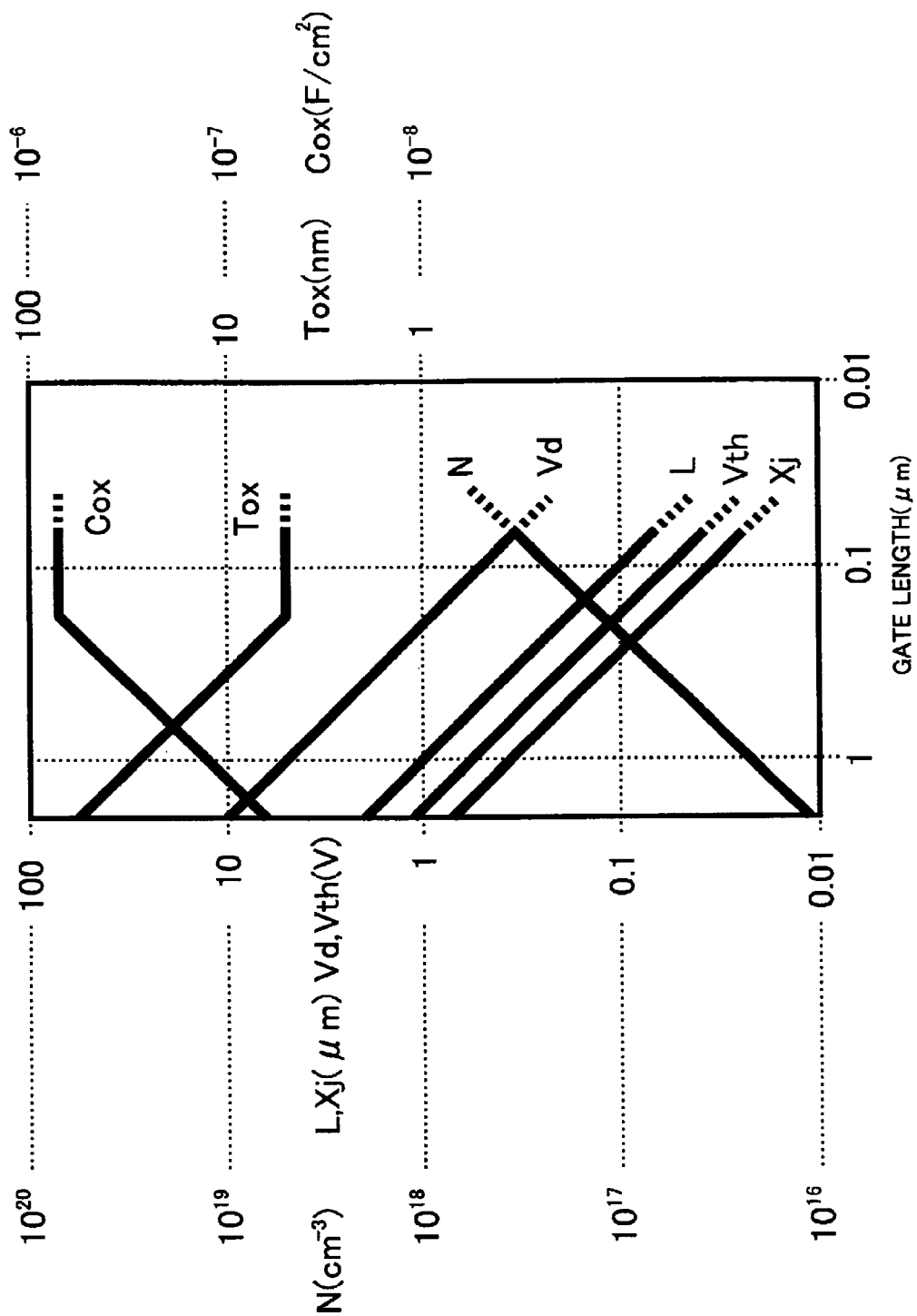
FIG. 27 shows a trend of device miniaturization in the conventional semiconductor device.
Figure 28:
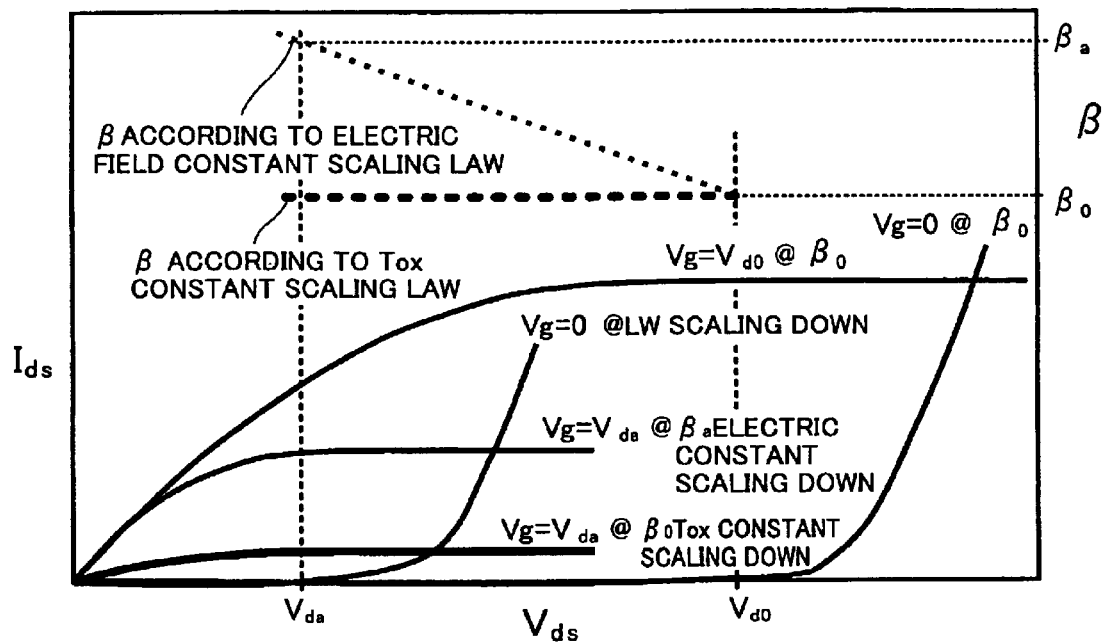
FIG. 28 shows the I–V characteristic of the device associated with scaling-down in the conventional semiconductor device.
Figure 29:
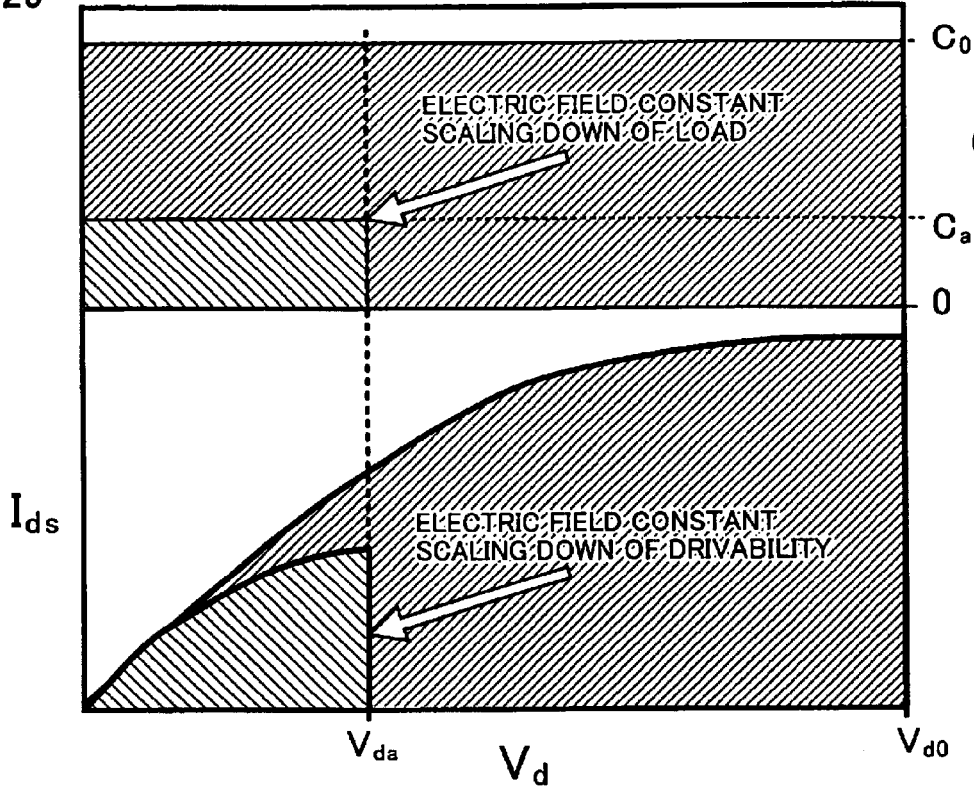
FIG. 29 shows the relationship between the drivability and the load of the device associated with the electric-field constant reduction in the conventional semiconductor device.
Figure 30:
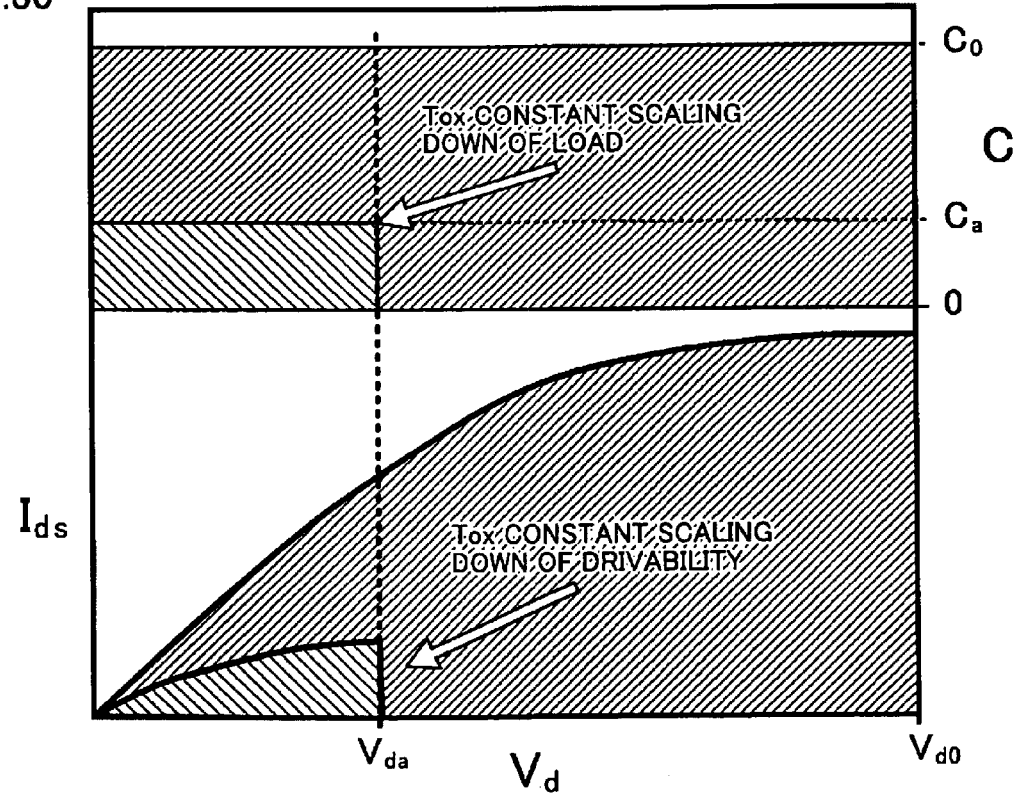
FIG. 30 shows the relationship between the drivability and the load of the device associated with constant reduction of thickness of insulation film (thickness of gate oxide film) $T_{OX}$ in the conventional semiconductor device.
Figure 31:
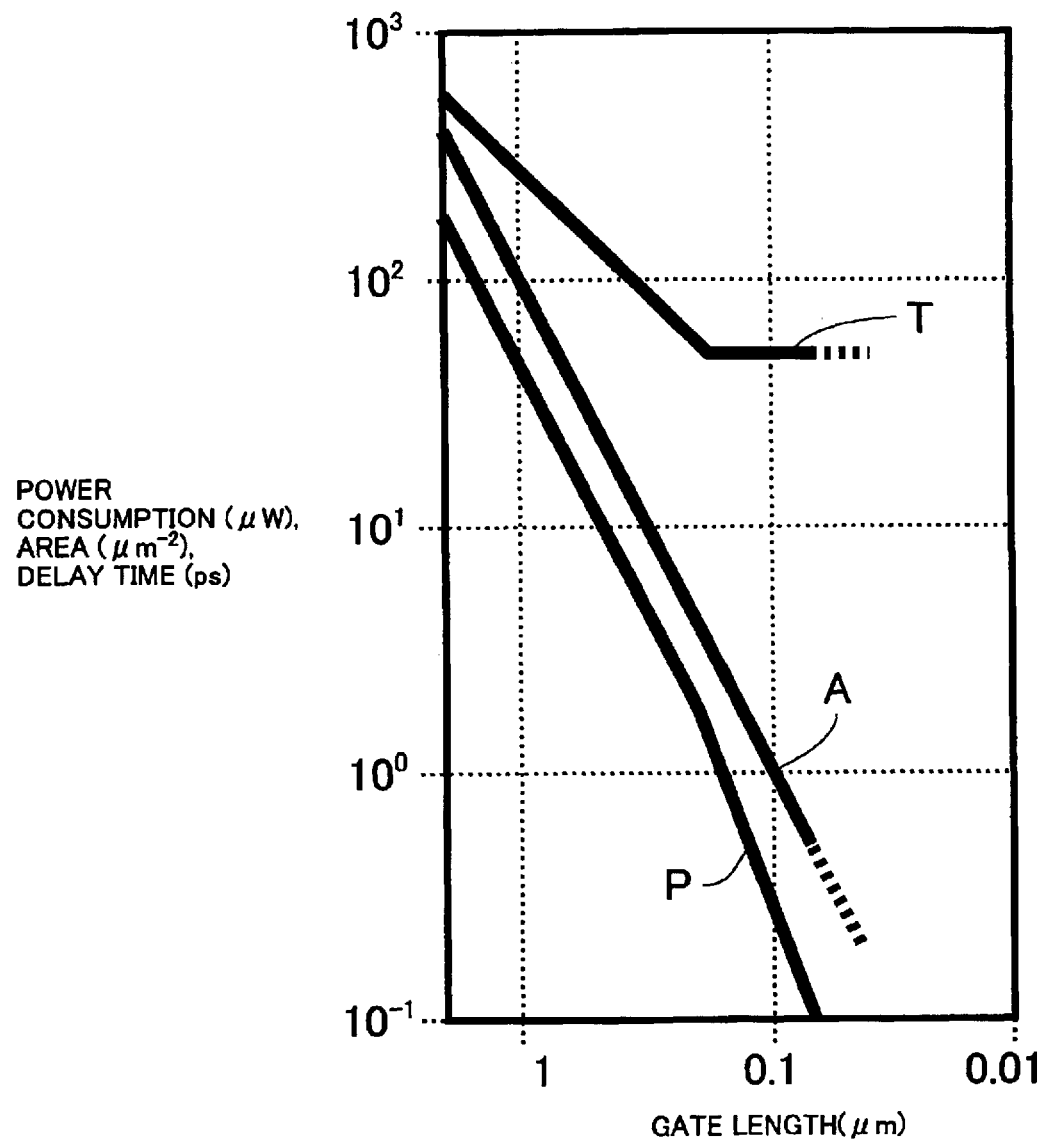
FIG. 31 shows a trend of the LSI performance associated with miniaturization of the semiconductor device in the conventional semiconductor device.

FIG. 25 shows an example of a reduced MA-MOS device. The miniaturization of the MA-MOS device is characterized in that, when power-supply voltage $V_d$ is constant, gate length L is constant and gate width W is reduced while the region with the comparatively high conductance is relatively extended in order to ensure the withstand voltage during the OFF state of the transistor.

The effective gate length of the normal conductance portion left within the gate is reduced as the device is miniaturized in order to improve gain coefficient β.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a source and a drain formed at respective impurity diffusion regions;
   a gate formed at a region between said source and said drain with an insulation film interposed; and
   a means for modulating a gain coefficient in accordance with a magnitude of a voltage between said source and said drain.

2. The semiconductor device according to claim 1, wherein
   said means modulates the gain coefficient in inversely proportional to the magnitude of the voltage between the source and drain.

3. The semiconductor device according to claim 1, wherein
   another impurity diffusion region with a lower impurity concentration compared to each of said impurity diffusion regions including said source and said drain is formed having an asymmetric shape with respect to a center line along which said gate extends, between said source and drain and a channel below said gate.

4. The semiconductor device according to claim 3, wherein the shape and size of said another impurity diffusion region is set to control an effect of modulating said gain coefficient.

5. The semiconductor device according to claim 3, further comprising:
   a plurality of electrode contact holes arranged at said source and said drain, wherein
   an interval of said plurality of electrode contact holes is set to control an effect of modulating said gain coefficient.

6. The semiconductor device according to claim 3, wherein
   an impurity concentration in said another impurity diffusion region is set to control an effect of modulating said gain coefficient.

7. The semiconductor device according to claim 3, further comprising:
   a plurality of electrode contact holes arranged at said source and said drain, wherein
   said semiconductor device is formed based on a prescribed miniaturization rule such that a closest distance between an electrode contact at said source and an electrode contact at said drain is always approximately constant.

8. A semiconductor integrated circuit device comprising a semiconductor device,
   said semiconductor device including
   a source and a drain formed at respective impurity diffusion regions,
   a gate formed at a region between said source and said drain with an insulation film interposed, and
   a means for modulating a gain coefficient in accordance with a magnitude of a voltage between said source and said drain.

9. The semiconductor integrated circuit according to claim 8, wherein
   said means modulates the gain coefficient in inversely proportional to the magnitude of the voltage between said source and said drain.

10. A semiconductor integrated circuit, comprising:
    a logic circuit including a p-type semiconductor device and an n-type semiconductor device,
    each of said p-type semiconductor device and said n-type semiconductor device including
    a source and a drain formed at respective impurity diffusion regions,
    a gate formed at a region between said source and said drain with an insulation film interposed, and
    a modulation control gate modulating a gain coefficient of said semiconductor device in accordance with an applied voltage,
    said logic circuit further including, in each of said p-type semiconductor device and said n-type semiconductor device, a means for delaying a signal input into said gate to transmit the input signal to said modulation control gate.

11. The semiconductor integrated circuit according to claim 10, wherein
    said means has a resistance component connected between said gate and said modulation control gate.

12. The semiconductor integrated circuit according to claim 11, wherein
    a resistance value of said resistance component is set in accordance with a load-drivability characteristic of said logic circuit.

13. A semiconductor integrated circuit, comprising:
    a logic circuit including a p-type semiconductor device and an n-type semiconductor device,
    each of said p-type semiconductor device and said n-type semiconductor device including
    a source and a drain formed at respective impurity diffusion regions,
    a gate formed at a region between said source and said drain with an insulation film interposed, and
    a modulation control gate modulating a gain coefficient of said semiconductor device in accordance with an applied voltage,
    said logic circuit further including, in each of said p-type semiconductor device and said n-type semiconductor device, a means for supplying a signal input into said gate to said modulation control gate.

14. A semiconductor device, comprising:

a source and a drain formed at respective impurity diffusion regions;

a gate formed at a region between said source and said drain with an insulation film interposed; and a means for modulating a gain coefficient in accordance with a magnitude of a voltage of said gate.

15. The semiconductor device according to claim 14, wherein said means modulates the gain coefficient in proportional to a magnitude of a gate voltage.

16. The semiconductor device according to claim 15, wherein in a channel portion below said gate between said source and said drain, a region with a comparatively high channel conductance or mutual conductance is formed at a part of said channel portion such that a region with a normal conductance remains at said channel portion, and said region with a comparatively high channel conductance or mutual conductance is formed to be asymmetric between said source and said drain.

17. The semiconductor device according to claim 16, wherein a modulation effect of said gain coefficient is controlled by setting a shape and a size of said region with a comparatively high channel conductance or mutual conductance.

18. A semiconductor integrated circuit, comprising a semiconductor device, said semiconductor device including a source and a drain formed at respective impurity diffusion regions, a gate formed at a region between said source and said drain with an insulation film interposed, and a means for modulating a gain coefficient in accordance with a magnitude of a voltage of said gate.

19. The semiconductor integrated circuit according to claim 18, wherein said means modulates a gain coefficient in proportional to the magnitude of said gate voltage.

* * * * *